(12) United States Patent
Mauder et al.

(10) Patent No.: US 9,490,250 B2
(45) Date of Patent: Nov. 8, 2016

(54) HALF-BRIDGE CIRCUIT WITH A LOW-SIDE TRANSISTOR AND A LEVEL SHIFTER TRANSISTOR INTEGRATED IN A COMMON SEMICONDUCTOR BODY

(71) Applicant: Infineon Technologies Austria AG, Villach (AT)

(72) Inventors: Anton Mauder, Kolbermoor (DE); Franz Hirler, Isen (DE); Joachim Weyers, Hoehenkirchen (DE); Uwe Wahl, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/606,374

(22) Filed: Jan. 27, 2015

(65) Prior Publication Data
US 2015/0162324 A1    Jun. 11, 2015

Related U.S. Application Data

(62) Division of application No. 13/429,579, filed on Mar. 26, 2012.

(51) Int. Cl.
| | |
|---|---|
| *H01L 27/06* | (2006.01) |
| *H01L 27/088* | (2006.01) |
| *H01L 29/78* | (2006.01) |
| *H01L 29/40* | (2006.01) |
| *H01L 29/861* | (2006.01) |
| *H01L 29/8605* | (2006.01) |
| *H01L 29/06* | (2006.01) |

(52) U.S. Cl.
CPC ......... *H01L 27/0629* (2013.01); *H01L 27/088* (2013.01); *H01L 29/407* (2013.01); *H01L 29/7801* (2013.01); *H01L 29/7803* (2013.01); *H01L 29/7804* (2013.01); *H01L 29/7811* (2013.01); *H01L 29/7813* (2013.01); *H01L 29/0619* (2013.01); *H01L 29/0653* (2013.01); *H01L 29/404* (2013.01); *H01L 29/7825* (2013.01); *H01L 29/7838* (2013.01); *H01L 29/8605* (2013.01); *H01L 29/8611* (2013.01)

(58) Field of Classification Search
CPC . H01L 29/78; H01L 29/404; H01L 29/8611; H01L 27/088; H01L 27/0629
USPC ........................... 327/108; 257/341, E29.256
See application file for complete search history.

(56) References Cited

U.S. PATENT DOCUMENTS

| | | | |
|---|---|---|---|
| 4,963,505 A * | 10/1990 | Fujii et al. | 438/405 |
| 5,285,369 A | 2/1994 | Balakrishnan | |
| 5,502,412 A | 3/1996 | Choi et al. | |

(Continued)

FOREIGN PATENT DOCUMENTS

| | | |
|---|---|---|
| CN | 102097441 A | 6/2011 |
| DE | 19617358 A1 | 11/1996 |

(Continued)

*Primary Examiner* — Jerome Jackson, Jr.
*Assistant Examiner* — David Spalla
(74) *Attorney, Agent, or Firm* — Murphy, Bilak & Homiller, PLLC

(57) ABSTRACT

A half-bridge circuit includes a low-side transistor and a high-side transistor each having a load path and a control terminal. The half-bridge circuit further includes a high-side drive circuit having a level shifter with a level shifter transistor. The low-side transistor and the level shifter transistor are integrated in a common semiconductor body.

8 Claims, 12 Drawing Sheets

(56) References Cited

U.S. PATENT DOCUMENTS

| | | |
|---|---|---|
| 5,767,562 A * | 6/1998 | Yamashita ........ H01L 21/76264 257/500 |
| 6,693,327 B2 | 2/2004 | Priefert et al. |
| 6,693,372 B2 | 2/2004 | Swart et al. |
| 7,709,891 B2 | 5/2010 | Mauder et al. |
| 8,247,874 B2 | 8/2012 | Hirler et al. |
| 8,278,731 B2 | 10/2012 | Sumitomo et al. |
| 8,461,648 B2 * | 6/2013 | Pfirsch ................ H01L 29/0634 257/328 |
| 8,704,329 B2 | 4/2014 | Qiao et al. |
| 8,815,701 B2 | 8/2014 | Sumitomo et al. |
| 2002/0060892 A1 | 5/2002 | Swart et al. |
| 2003/0222327 A1 * | 12/2003 | Yamaguchi ......... H01L 29/0634 257/500 |
| 2005/0032291 A1 | 2/2005 | Baliga |
| 2005/0045922 A1 | 3/2005 | Ahlers et al. |
| 2007/0063737 A1 * | 3/2007 | Ludikhuize ......... H02M 3/1588 326/83 |
| 2007/0181943 A1 * | 8/2007 | Pfirsch ................ H01L 29/7825 257/343 |
| 2008/0265320 A1 | 10/2008 | Mauder et al. |
| 2009/0127624 A1 | 5/2009 | Sumitomo et al. |
| 2009/0212373 A1 * | 8/2009 | Karino et al. ................ 257/369 |
| 2009/0302347 A1 | 12/2009 | Matsunaga et al. |
| 2012/0049273 A1 | 3/2012 | Hirler et al. |
| 2012/0256252 A1 | 10/2012 | Gui et al. |
| 2012/0302036 A1 | 11/2012 | Sumitomo et al. |
| 2013/0256800 A1 | 10/2013 | Qiao et al. |

FOREIGN PATENT DOCUMENTS

| | | |
|---|---|---|
| DE | 10106359 C1 | 9/2002 |
| DE | 102007004091 A1 | 8/2008 |
| DE | 102008058013 A1 | 5/2009 |
| DE | 102011081589 A1 | 3/2012 |
| EP | 0176747 A1 | 4/1986 |
| EP | 0741416 A1 | 11/1996 |
| WO | 2006047689 A2 | 5/2006 |
| WO | 2006048689 A2 | 5/2006 |
| WO | 2011158647 A1 | 12/2011 |

* cited by examiner

E-E

HALF-BRIDGE CIRCUIT WITH A LOW-SIDE TRANSISTOR AND A LEVEL SHIFTER TRANSISTOR INTEGRATED IN A COMMON SEMICONDUCTOR BODY

PRIORITY CLAIM

This application is a Divisional of U.S. patent application Ser. No. 13/429,579, filed Mar. 26, 2012, said application incorporated herein by reference in its entirety.

TECHNICAL FIELD

Embodiments of the present invention relate to a semiconductor arrangement, in particular a semiconductor arrangement with a power transistor and a high voltage device integrated in a common semiconductor body.

BACKGROUND

Power transistors, such as power MOSFETs (metal oxide semiconductor field effect transistors) or power IGBTs (insulated gate bipolar transistors), are widely used as electronic switches for switching electric loads, such as motors, actors, lamps, or the like. In many applications, load paths of two power transistors are connected in series between terminals for positive and negative supply potentials so as to form a half-bridge circuit, where the load is coupled to an output of the half-bridge. In a half-bridge circuit the transistor connected between output and a terminal for a negative supply potential is referred to as low-side transistor (low side switch), while the transistor connected between a terminal for the positive supply potential and the output is referred to as high-side transistor (high-side switch).

A power transistor is a voltage controlled device that can be controlled by a drive signal (drive voltage) received by a control terminal, which in a MOSFET or an IGBT is a gate terminal. While the low-side transistor can be controlled using a drive signal that is referenced to the negative supply potential, driving the high-side transistor requires a drive signal that is either referenced to the positive supply potential or to the electrical potential at the output terminal, where the electrical potential at the output terminal may vary between the negative supply potential and the positive supply potential, dependent on the switching state of the half-bridge. For driving the high-side transistor and the low-side transistor it is desirable to use a control circuit that generates control signals referenced to the negative supply potential. While the control signal for the low-side switch may be directly used for driving the low-side transistor, a level shifter may be required for shifting a signal level of the control signal for the high-side transistor to a suitable signal level for driving the high-side transistor or to a signal level suitable to be processed by a drive circuit for the high-side transistor.

A level shifter, however, may require a high voltage device, such as a further transistor, that has a voltage blocking capability similar to the voltage blocking capability of the low-side transistor.

In order to reduce manufacturing costs and to reduce the size there is a need to implement a power transistor and a high voltage device in a common semiconductor body.

SUMMARY

A first embodiment relates to a semiconductor arrangement, including a semiconductor body, a power transistor, and a high voltage device. The power transistor includes a source region, a drain region, a body region and a drift region arranged in the semiconductor body, a gate electrode arranged adjacent to the body region and dielectrically insulated from the body region by a gate dielectric. The high voltage device is arranged within a well-like dielectric structure in the semiconductor body and includes a further drift region.

A second embodiment relates to a half-bridge circuit, including a low-side transistor and a high-side transistor each comprising a load path and a control terminal, a high-side drive circuit comprising a level shifter with a level shifter transistor, wherein the low-side transistor and the level shifter transistor are integrated in a common semiconductor body.

A third embodiment relates to a semiconductor arrangement. The semiconductor arrangement includes a semiconductor body having a first surface, a vertical power transistor, an edge termination, and a high voltage device. The vertical power transistor includes a source region, a drain region, a body region and a drift region arranged in the semiconductor body, a gate electrode arranged adjacent to the body region and dielectrically insulated from the body region by a gate dielectric. The edge termination is arranged in the region of the first surface of the semiconductor body, the edge termination defines a ring wherein at least the source region of the power transistor is arranged inside the ring. The high voltage device includes a drift region extending from inside the ring as defined by the edge structure to outside the ring as defined by the edge structure. The high voltage device is arranged within a well-like structure including dielectric sidewalls and a bottom region of a conductivity type complementary to the conductivity type of the drift region and adjoining the dielectric sidewalls.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
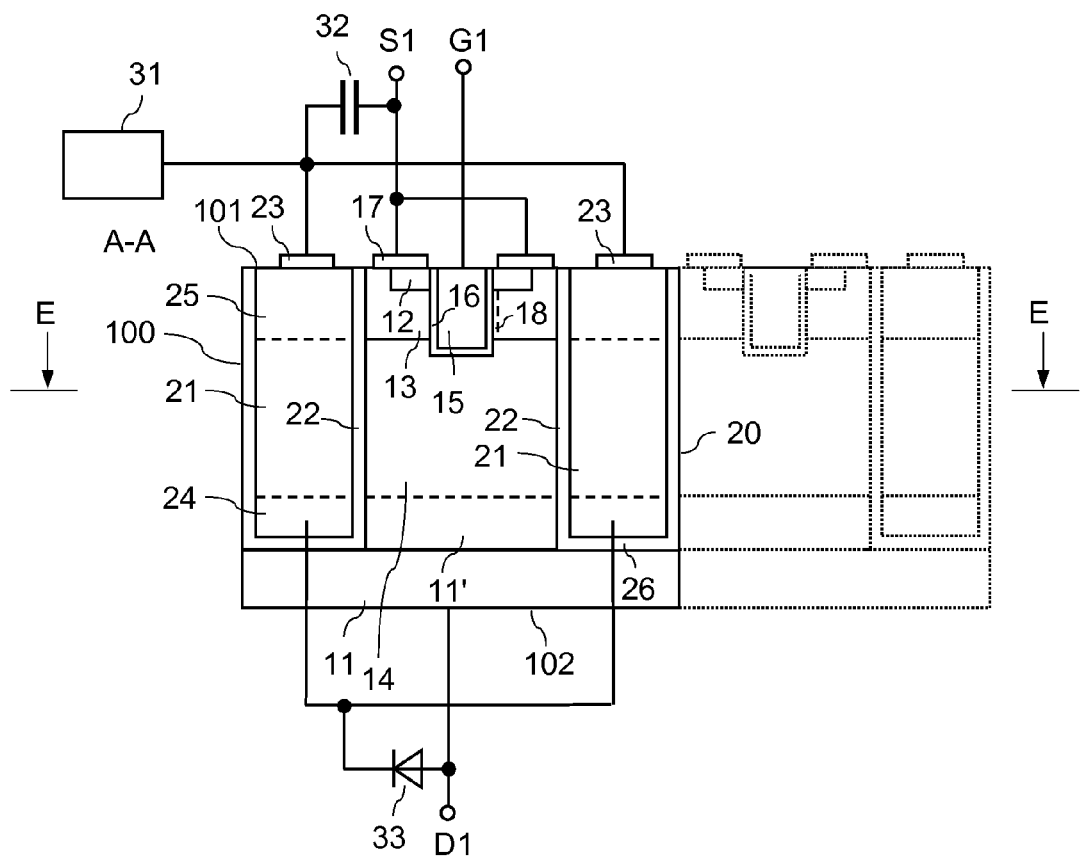
FIG. 1 illustrates a vertical cross sectional view of a vertical power transistor having a drift region and a drift control region integrated in a semiconductor body.

FIG. 1 illustrates a vertical cross sectional view of a vertical power transistor, in particular of a vertical power MOSFET that has active semiconductor device regions integrated in a semiconductor body 100. FIG. 1 shows a vertical cross sectional view of the semiconductor body 100, which is a cross sectional view in a vertical section plane that extends perpendicular to a first surface 101 and a second surface 102 of the semiconductor body 100.

Referring to FIG. 1, the MOSFET includes a drain region 11, a source region 12, a body region 13 and a drift region 14. The drain and source regions 11, 12 are arranged distant in a current flow direction of the device, where the current flow direction is the vertical direction of the semiconductor body 100 in the present embodiment. The body region 13 is arranged between the source region 12 and the drift region 14, and the drift 14 region is arranged between the body region 13 and the drain region 11. The drain region 11 is electrically connected to a drain terminal D1 that is only schematically illustrated in FIG. 13. The source region 12 and the body region 13 are electrically connected to a source electrode 17 which forms or which is connected to a source terminal S1.

The MOSFET further includes a gate electrode 15 which extends from the source region 12 through the body region 13 to or into the drift region 14. The gate electrode 15 is dielectrically insulated from the semiconductor regions implemented in the semiconductor body 100 by a gate dielectric 16, and is connected to a gate terminal G1. The gate dielectric 16 can be a conventional gate dielectric and includes, for example an oxide or a nitride. In the example illustrated in FIG. 1, the gate electrode 15 is a trench electrode that is arranged in a trench of the semiconductor body 100 in which the MOSFET is implemented. However, this is only an example. The gate electrode 15 could also be implemented as a planar electrode (not shown) above the first surface 101 of the semiconductor body 100.

The MOSFET can be implemented as an n-type MOSFET or as a p-type MOSFET. In an n-type MOSFET, the source region 12 and the drain region 11 are n-doped while the body region 13 is p-doped. In a p-type MOSFET, the source region 12 and the drain region 11 are p-doped while the body region 13 is n-doped. The doping concentration of the drain region 11 and the source region 12 is, for example in the range of between $5E17$ $cm^{-3}$ and $1E21$ $cm^{-3}$. The doping concentration of the body region 13 is, for example, in the range of between $1E16$ $cm^{-3}$ and $1E19$ $cm^{-3}$.

The MOSFET can be implemented as an enhancement (normally-off) MOSFET or as a depletion (normally-on) MOSFET. In an enhancement MOSFET, the body region 13 extends to the gate dielectric 16. In a depletion MOSFET, either the body region 13 includes at least along the gate dielectric 16 channel region 18 (illustrated in dashed lines) of the same conductivity type as the source region 12 and extending along the gate dielectric 16 between the source region 12 and the drift region 14, or the gate dielectric 16 includes fixed charges (positive charges in an n-type MOSFET) that cause a conducting channel in the body region 13 when the gate-source voltage is zero.

In the type of MOSFET illustrated in FIG. 1, the drift region 14 can have the same doping type (conductivity type) as the source region 12 and the drain region 11, but could also be doped complementarily to the source region 12 and the drain region 11, wherein at least a section of the drift region 14 between a vertical dielectric layer 22 which will be explained in the following and a channel region of the MOSFET may have the same doping type as the source region 12. The "channel region" of the MOSFET is a region of the body region 13 along the gate dielectric 16 where the gate electrode 15 controls a conducting channel. The doping concentration of the drift region 14 is, for example, in the range of between $1E12$ $cm^{-3}$ and $1E15$ $cm^{-3}$.

The MOSFET further includes a drift control region 21 that is dielectrically insulated from the drift region 14 by the vertical dielectric layer 22. The vertical dielectric layer 22 acts as a drift control region dielectric. The drift control region 21 is configured to generate a conducting channel in the drift region 14 along the drift control region dielectric 22 when the MOSFET is in an on-state, so as to reduce the on-resistance of the MOSFET. The MOSFET, like a conventional MOSFET, is in the on-state, when an electrical potential is applied to the gate terminal G that causes a conducting channel in the body region 13 between the source region 12 and the drift region 14 along the gate dielectric 16, and when an electrical voltage is applied between the drain and the source terminals D, S. The conducting channel along the gate control region dielectric 22 is an accumulation channel when the drift region 14 has the same doping type as the source drain regions 12, 11, and is an inversion channel, when the drift region 14 is doped complementarily to these regions. The doping type of the drift control region 21 can correspond to the doping type of the drift region 14 or can be complementary.

The MOSFET further includes a biasing source 31 coupled to the drift control region 21 via a contact electrode 23. According to one embodiment (not illustrated) the biasing source 31 includes a rectifier element, such as a diode, connected between the gate terminal G and the drift control region 21. A capacitive element 32, such as a capacitor, may be coupled between the drift control region 21 and a terminal for a reference potential, such as the source terminal S. Further, a rectifier element 33, such as a diode, may be connected between the drain region 11 and a drain-sided end of the drift control region 21. Optionally, the rectifier element 33 is connected to a connection region 24 of the same doping type as the source region 12, and more highly doped than the drift control region 21.

The MOSFET may further include a semiconductor zone 25 of the same doping type as the body region 13 or complementary to the doping type of the source region 12. In this case, the biasing source 31 and the optional capacitive element 32 are connected to this semiconductor zone 25 via the contact electrode 23. According to one embodiment, the doping type of the drift control region 21 corresponds to the doping type of the drift region 14.

The operating principle of the MOSFET according to FIG. 1 is now explained. For explanation purposes it is assumed that the MOSFET is an n-type MOSFET with an n-doped drift zone 14, and that the drift control region 21 has the same doping type as the drift region 14. The biasing source 31 is configured to bias the drift control region 21 to have a positive potential relative to the electrical potential of the source terminal S (source potential), when the MOSFET is in the on-state. The MOSFET is in the on-state, when the drive potential applied to the gate terminal G generates a conducting channel in the body region 13 between the source region 12 and the drift region 14, and when a positive voltage is applied between the drain and the source terminals D, S. In the on-state, the drift control region 21, which has a higher electrical potential than the drift region 14, generates an accumulation channel along the gate control region dielectric 22 in the drift region 14. This accumulation channel significantly reduces the on-resistance as compared to a MOSFET without a drift control region.

The MOSFET is in the off-state, when the channel in the body region 13 is interrupted. In this case, a depletion region expands in the drift region 14 beginning at a pn-junction between the body region 13 and the drift region 14. The depletion region expanding in the drift region 14 causes a depletion region also to expand in the drift control region 21, which, like the drift region 14, may include a monocrystalline semiconductor material. By virtue of a depletion region expanding in the drift region 14 and a depletion region expanding in the drift control region 21, a voltage across the drift control region dielectric 22 is limited. The capacitive storage element 32 serves to store electrical charges that are required in the drift control region 21 when the MOSFET is in its on-state. The rectifier element 33 allows charge carriers that are thermally generated in the drift control region 21 to flow to the drain region 11. This rectifier element is connected up such that in the on-state of the MOSFET the drift control region 21 may assume a higher electrical potential than the potential at the drain terminal, so that the drift control region 21 is not discharged.

In the MOSFET illustrated in FIG. 1, the drift control region 21 is not only dielectrically insulated from the drift region 14 by the vertical drift control region dielectric 22, but is also dielectrically insulated from the drain region 11 by a horizontal dielectric layer 26. The vertical dielectric drift control region dielectric 22 and the horizontal dielectric layer 26 form an insulating, well-like structure in which the drift control region 21 is arranged. This dielectric structure will be referred to as dielectric well 20 in the following.

In the embodiment illustrated in FIG. 1, one drift region 14 is arranged between two drift control regions 21. A device structure with one gate electrode 15 and the corresponding gate dielectric 16, one drift region 14, one drift control region dielectric 22 and one drift control region 21 can be referred to as one transistor cell. However, one may also consider a structure with one source region 12, one body region 13, one drift control region dielectric 22, one half of a drift control region 21 and one half of the drift region 14 as one transistor cell. As illustrated in dotted lines in FIG. 1, the power transistor may include a plurality of transistor cells connected in parallel. The transistor cells are connected in parallel by having their source electrodes 17 connected to a common source terminal S1, by having their gate electrodes 16 connected to a common gate terminal G1 and by having the terminals 23 of the drift control regions 21 connected to the biasing circuit 31. The individual transistor cells have the drain region 11 in common.

The drain region 11 can be arranged only below the lateral dielectric layer 26 below the drift control region 21. However, according to one embodiment (illustrated in dashed lines in FIG. 1) a section of the drift region 11' may also extend between two neighboring drift control region dielectrics 22 towards the first surface 101.

Figure 2:
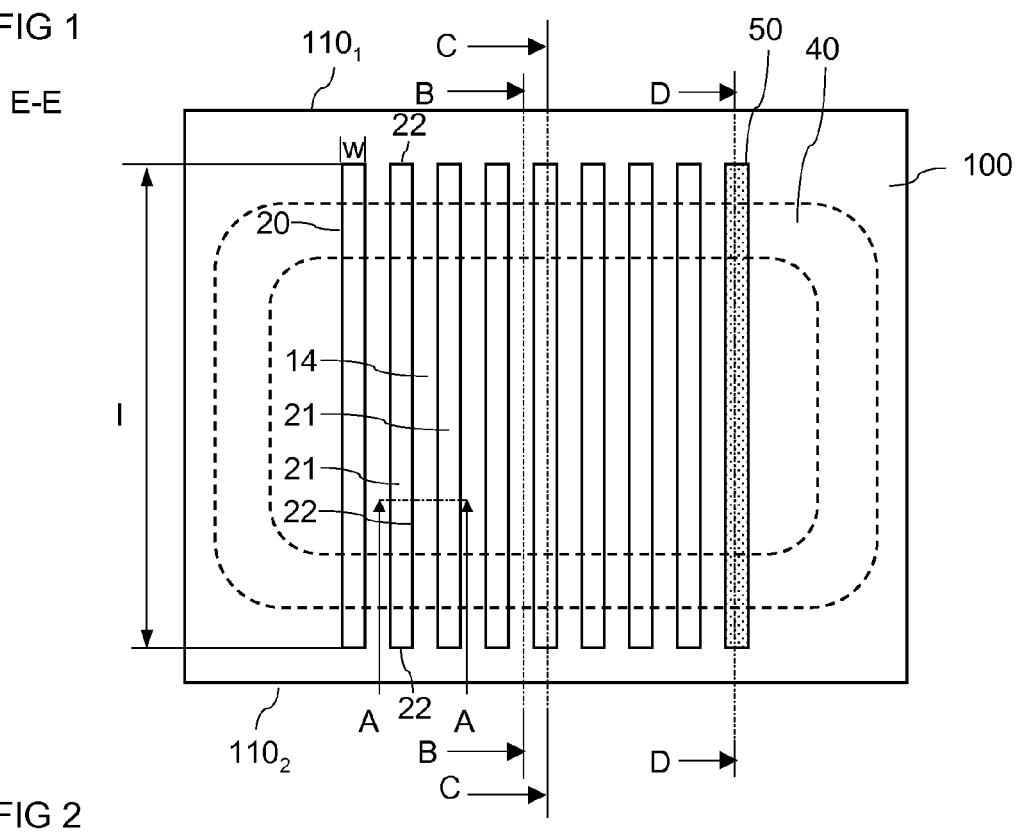
FIG. 2 illustrates a horizontal cross sectional view of the semiconductor body according to a first embodiment.

FIG. 2 illustrates a horizontal cross sectional view of the semiconductor body 100 according to one embodiment. The cross section illustrated in FIG. 2 is a cross section of the drift control region 21 and the drift region 14. Referring to FIG. 2, in the semiconductor body 100 a plurality of dielectric wells 20 including the drift control region dielectric 22 and the horizontal dielectric layer 26 are integrated, with one drift control region 21 being arranged within each dielectric well 20. Referring to FIG. 2, the dielectric wells 20 are longitudinal structures having a longitudinal direction extending in a lateral direction of the semiconductor body 100 and, therefore, perpendicular to the section plane illustrated in FIG. 1. The individual dielectric wells 20 are arranged distant to each other in a direction perpendicular to their longitudinal directions, wherein one drift region 14, at least one body region 13, at least one source region 12, a gate electrode 15 and a gate dielectric 16 is arranged between two dielectric wells 20. In FIG. 2, these individual device regions are not shown. Reference character denotes one of the regions between two neighboring dielectric wells 20 in which these device regions are implemented.

A length l which is a dimension in the longitudinal direction, of the dielectric wells 20 is, for example, in the range of several micrometers (μm) up to several millimeters (mm). A width w of these dielectric wells 20, which is a dimension in a direction perpendicular to the longitudinal direction is, for example, in the range of between several 10 nanometers (nm) up to several 10 μm, such as, e.g., between 100 nm and 20 μm, or between 500 nm and 5 μm. Although, for illustration purposes, only several dielectric wells 20 are illustrated in FIG. 2, the power transistor may include up to several 10,000 ($10^5$) transistor cells, with each transistor cell including a dielectric well 20 with a drift control region 21.

In the embodiment illustrated in FIG. 2, the MOSFET includes a plurality of drift control regions 21, where the individual drift control regions 21 are elongated semiconductor regions that are dielectrically insulated from the neighboring drift regions 14 and the drain region 11. In the horizontal (lateral) direction the individual drift control regions 21 are surrounded by one drift region 14. In other words, the individual drift control regions 21 and the drift control region dielectric 22 are embedded in one drift region 14 in this embodiment. In this embodiment, there are a plurality of dielectric wells 20 each including sidewalls formed by the drift control regions dielectrics and a bottom formed by a horizontal dielectric layer 26, with each of these dielectric wells 20 including one drift control region 21.

Figure 3:
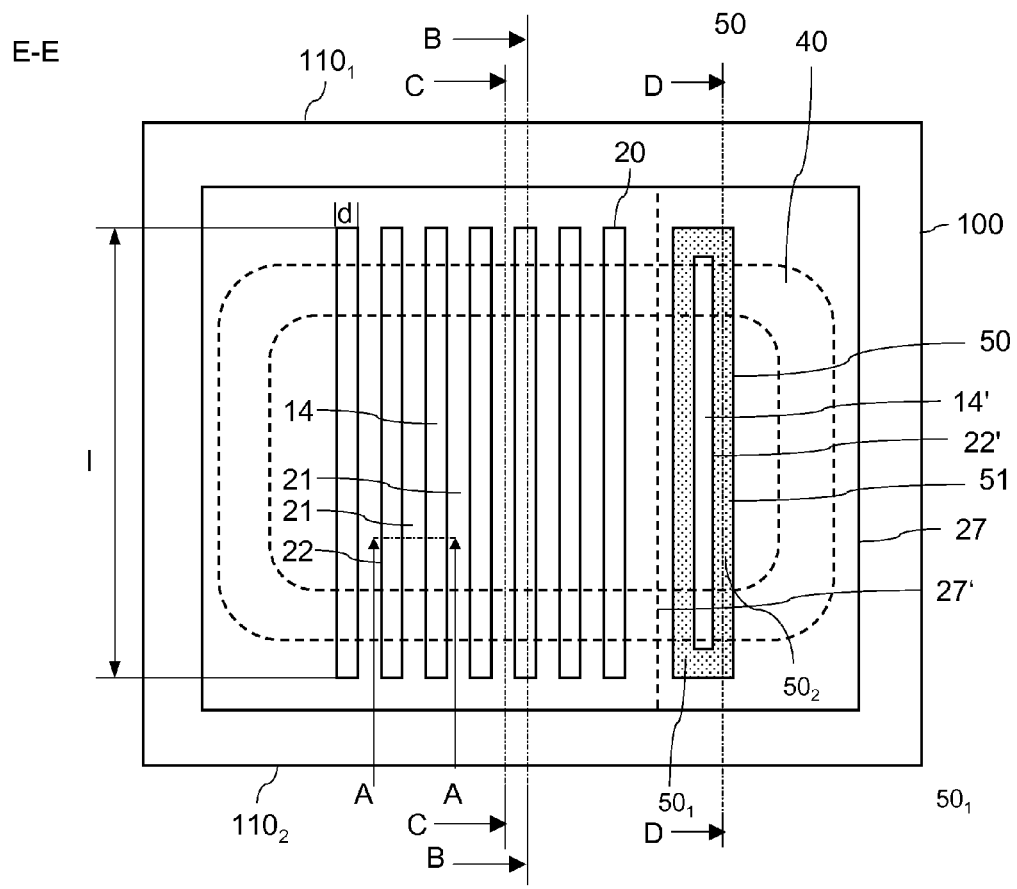
FIG. 3 illustrates a horizontal cross sectional view of the semiconductor body according to a second embodiment.

FIG. 3 illustrates a horizontal cross sectional view of the semiconductor body 100 according to a second embodiment. In this embodiment, the MOSFET includes a plurality of drift regions 14, where the individual drift regions 14 are elongated semiconductor regions that are dielectrically insulated from the neighboring drift control regions 21. In the horizontal (lateral) direction the individual drift regions 14 are surrounded by one drift control region 21. In other words, the individual drift regions 14 are embedded in one drift control region 21 separated from the drift regions 14 by drift control region dielectrics 22 in this embodiment. A further dielectric layer 27 surrounds the drift control region 21 and in the vertical direction extends to the horizontal dielectric layer 26. In this embodiment, there is one dielectric well 20 with an outer sidewall formed by the dielectric layer 27 and a bottom formed by the horizontal dielectric layer 26, and with a plurality of ring-shaped vertical dielectric layers formed by the drift control region dielectrics 22 surrounding the individual drift regions 14. As illustrated in FIG. 1, the drift regions 14 adjoins the drain region 11, while the drift control region 21 is insulated from the drain region 11 by the insulation layer 26.

A width d of these drift regions 14, which is a dimension in a direction perpendicular to the longitudinal direction is, for example, in the range of between several 10 nanometers (nm) up to several 10 μm, such as, e.g., between 100 nm and 20 μm, or between 500 nm and 5 μm.

In the following, the wording "at least one dielectric well" denotes the plurality of dielectric wells as illustrated in FIG. 2, or the one dielectric well illustrated in FIG. 3.

Referring to FIGS. 2 and 3, the power transistor with the at least one dielectric well 20 and the active transistor regions arranged within the dielectric well 20 (see FIG. 3) or between dielectric wells 20 (see FIG. 2) can be implemented such that the at least one dielectric well 20 in its longitudinal direction extends between two edge regions of the semiconductor body 100. The wording "edge regions" of the semiconductor body 100 denotes regions of the semiconductor body 100 close to edge surfaces, where an edge surface of the semiconductor body 100 is a surface that borders the semiconductor body 100 in a lateral direction. In the embodiments illustrated in FIGS. 2 and 3, the at least one dielectric well 20 extends from a first edge region adjoining a first edge surface $110_1$ to a second edge region adjoining a second edge surface $110_2$.

When the power transistor is in operation and is switched off, a voltage between the drain terminal D1 and the source terminal S1 can be up to several 100V, dependent on a voltage blocking capability of the power transistor. In the vertical direction of the semiconductor body 100, mainly the space charge region in the drift region 14 or the drift control region 21 absorbs this voltage. Due to imperfections of the crystal lattice of the semiconductor body 100 along the edge surfaces $110_1$, $110_2$ and/or due to a basic doping concentration of the semiconductor body 100 in the edge region $110_1$, $110_2$, the edge surfaces $110_1$, $110_2$ may not provide an electrical isolation between the second surface 102 formed by the drain region 11 and the first surface 101, where the source and body regions 12, 13 are arranged. Moreover, it is even desirable to keep the edge surfaces $110_1$, $110_2$ on the same potential as the second surface 102 of the semiconductor body 100 in order to avoid leakage currents. Thus, the voltage between the drain terminal D1 and the source terminal S1 is also to be absorbed in the region of the first surface 101 between the edge surfaces $110_1$, $110_2$ and those regions where the source and body regions 12, 13 are arranged between the dielectric wells 20. To accomplish this, an optional junction termination system 40 may be arranged in and/or on the semiconductor body 100 close to the first surface 101 and may have the form of a ring that subdivides the semiconductor body 100 in an inner region and an outer region. According to one embodiment, the source and body regions 12, 13 as well as the gate electrode 15 of the individual transistor cells are arranged within the inner region of the ring-shaped edge termination structure 40. The dielectric wells 20 may extend through the edge termination structure 40 or below the edge termination structure 40 into the edge region of the semiconductor body 100, where the edge region is arranged in the outer region as defined by the edge termination structure 40.

Figure 4:
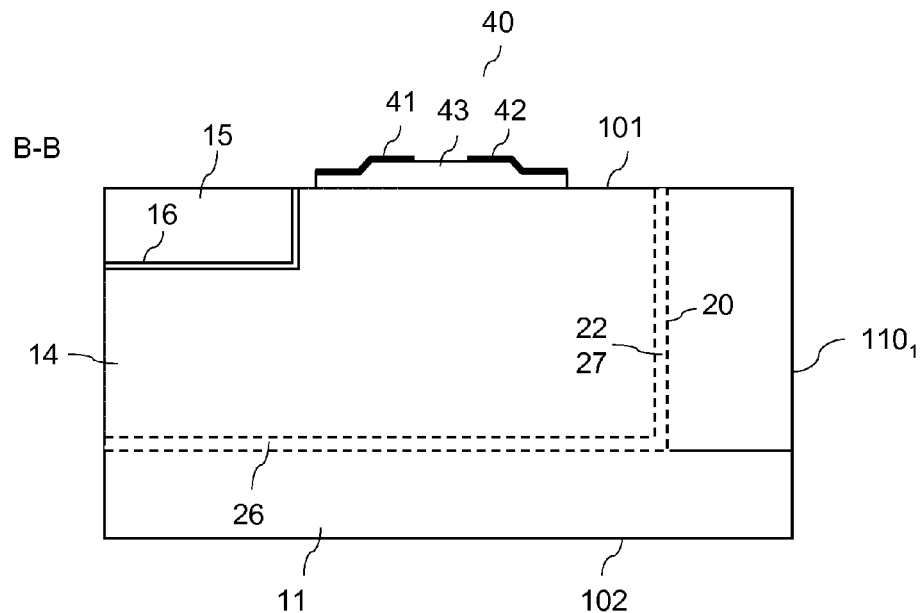
FIG. 4 illustrates a vertical cross sectional view through a drift region of the power transistor in an edge region of the semiconductor body.

FIG. 4 illustrates a vertical cross sectional view of a section of the drift region 14 in a section plane B-B illustrated in FIG. 2. Referring to FIG. 4, the gate electrode 15 as well as the source and body regions (not illustrated in FIG. 4) do not extend to the edge region of the semiconductor body 100, and do not even extend to an end of the at least one the dielectric well 20 in the longitudinal direction of the drift regions 14. FIG. 4 illustrates a vertical cross sectional view of the drift region 14, the gate electrode 15 and the gate dielectric 16 in a region adjoining an edge region of the semiconductor body 100. In dashed lines the position of the at least one dielectric well 20, in particular the position of a section of the horizontal dielectric layer 26 and of a vertical dielectric layer forming an end of the at least one dielectric well 20 is illustrated. The vertical dielectric layer forming the end of the at least one dielectric well in the longitudinal direction of the drift region 14 is dielectric layer 22 illustrated in FIG. 2 or is dielectric layer 27 illustrated in FIG. 3. The end of the at least one dielectric well 20 towards the longitudinal end of the drift region 14 will be referred to as longitudinal end of the at least one dielectric well in the following.

As can be seen from FIG. 4, the gate electrode 15, and also the source region 12 and the body region 13 (see FIG. 1, but not illustrated in FIG. 4) are arranged distant to the longitudinal end of the dielectric well 20 and, therefore, distant to the edge region of the semiconductor body 100. A doping concentration of a doped region between the edge surface $110_1$ and the gate electrode 15 may correspond to the doping concentration of the drift region 14. This doped region absorbs the voltage between the edge surface $110_1$ and the gate terminal 15, the source region 12 and the body region 13, respectively. In the switched-off state of the power transistor the electrical potential of the gate electrode 15 corresponds to the electrical potential of the source and body regions 12, 13. In an alternative embodiment (not shown) the gate structure may include several gate electrodes (each with a corresponding gate dielectric) that are distant in the longitudinal direction of the well 20.

Referring to FIG. 4, the edge termination structure 40 may include one or more field plates 41 and/or 42 that are arranged above the first surface 101 of the semiconductor body 100 on a dielectric layer 43. According to one embodiment, a first field plate 41, which is a field plate arranged closer to the inner region may be electrically connected to the gate electrode 15, the source region 12 or the body region 13 of the power transistor. A second field electrode 42, which is arranged closer to the outer region may be, for example, electrically connected to the drain region 11 or the edge region of the semiconductor body 100. Forming the edge termination structure 40 with field electrodes, such as field electrodes 41, 42 illustrated in FIG. 4, is only one of a plurality of different possibilities to implement the edge termination structures. According to further embodiments (not illustrated), the edge termination structure 40 additionally or alternatively to the field electrodes 41, 42 includes doped field rings which optionally are connected to field plates, JTE- (junction termination extension) doping, electroactive coatings like e.g. diamond-like carbon, semi-isolating coatings or VLD-(Variation of Lateral Doping)-regions to name a few of the possible edge terminations. According to further embodiments (not shown) a combination of one or more of these edge termination means may be used. These types of edge termination structures are commonly known, so that no further explanations are required in this regard.

Figure 5:
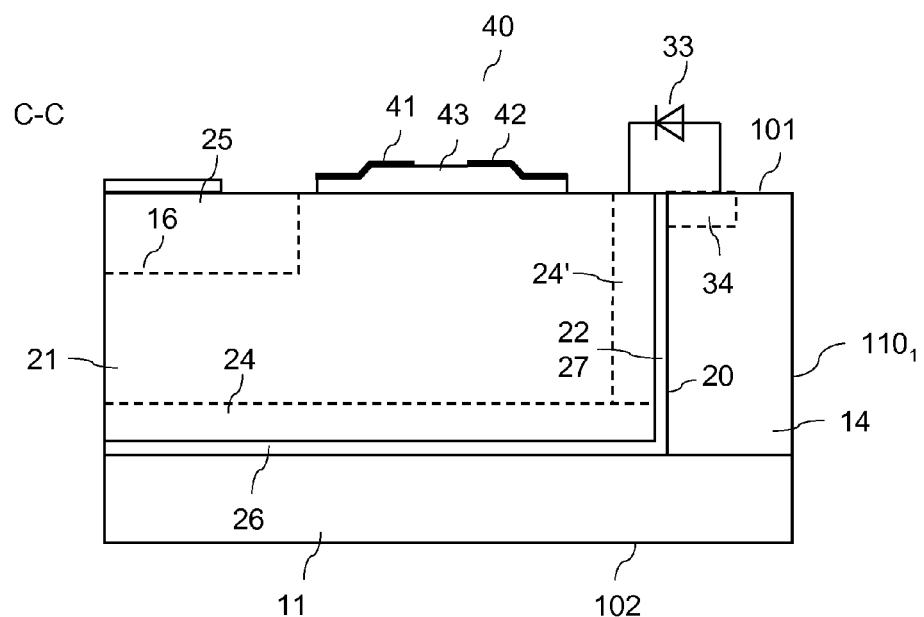
FIG. 5 illustrates a vertical cross sectional view through a drift control region of the power transistor in an edge region of the semiconductor body.

FIG. 5 illustrates a vertical cross sectional view of the at least one dielectric well 20 including a drift control region 21. In this embodiment, the rectifier element 33 that, referring to FIG. 1, is connected between the drain region 11 and the drift control region 21 is connected between an optional contact region 34 in the region of the first surface 101 and arranged in the edge region of the semiconductor body 100, and an optional connection region 24'. The connection region 24' extends in the vertical direction of the semiconductor body 100 from the first surface 101 to the contact region 24 arranged at a drain-sided end of the drift control region 21. The "drain-sided end" of the drift control region 21 is the end of the drift control region facing the drain region 11. The connection region 24' extends along that section of the drift control region dielectric 22 that forms a longitudinal end of the dielectric well 22 from the first surface 101 to the contact region 24.

The optional semiconductor zone 25 of the same conductivity type as the body region (13 in FIG. 1) and complementary to the source region is arranged distant to the longitudinal end of the at least one dielectric well 20 and is arranged in the inner region of the semiconductor body 100 as defined by the ring-shaped edge terminal structure 40. The contact region 34 arranged in the edge region of the semiconductor body 100 may have the same doping type as the drain region 11 or the drift region 14 arranged in the vertical direction of the semiconductor body 100 between the drain region 11 and the contact region 34. The drift control region 21 may have a doping concentration corresponding to a doping concentration of the drift region 14.

Referring to FIGS. 2 and 3, besides the vertical power transistor with the at least one drift region 14 and the at least one drift control region 21, at least one high voltage device is implemented in a further dielectric well 50 within the semiconductor body 100. The "high voltage device" is a semiconductor device with a voltage blocking capability of several 10V or even several 100V, dependent on the specific implementation. The voltage blocking capability of the high voltage device may correspond to the voltage blocking capability of the power device. However, the high voltage device may be implemented to have a much lower current bearing capability or a much higher on-resistance than the power transistor.

In the embodiment of FIG. 2, the further dielectric well 50 may be implemented like the dielectric wells 20 in which the drift control regions 21 are implemented. In the embodiment of FIG. 3, the further dielectric well 50 is an additional well within the dielectric well 20. This additional well 50 can be ring-shaped and can be arranged around a semiconductor region 14' connected to the drain region 11 and corresponding to the drift regions 14. The additional dielectric well 50 and/or the semiconductor region 14' may incorporate further devices dielectrically insulated from the main transistor. The further dielectric well 50 is formed by providing an additional ring-shaped vertical dielectric layer 51 around the vertical dielectric layer 22' corresponding to the drift control region dielectric 22. The semiconductor regions within the further dielectric well 50 are drawn with a dotted pattern in FIGS. 2 and 3. These semiconductor regions are enclosed by the dielectric well 50 in the vertical and the horizontal direction.

The further dielectric well 50 may be located inside the surrounding dielectric layer 27. However, this is only an example. In another embodiment, the further dielectric well 50 may in a lateral direction be located outside the surrounding dielectric layer 27 as depicted by the dashed line 27' in FIG. 2. In another embodiment, the further dielectric well 50 may be located inside a different surrounding dielectric layer which does not surround the active transistor cells (not shown in FIG. 2).

The further dielectric well 50 can be formed at the edge of a field of transistor cells of the vertical power transistor. In the embodiments illustrated in FIGS. 2 and 3, there is one further dielectric well 50, where the dielectric well 50 of FIG. 3 includes two sections 501, 502, one section on each side of the elongated semiconductor region 14'. Between the further dielectric well 50 and the neighboring dielectric well 20 including a drift control region 21 active transistor regions, which means source and body regions 12 and 13 can be implemented. However, it is also possible to omit the source regions 12 and to only provide a doped region between these dielectric wells 20, 50 that corresponds to the body region 13.

The high voltage device implemented in the further dielectric well 50 can be implemented as a lateral power device, where any type of lateral power device, such as a lateral power transistor, a lateral power diode, or the like, can be implemented. In an alternative embodiment a plurality of further dielectric wells 50 can be implemented containing the same type or different types of high voltage devices.

Figure 6:
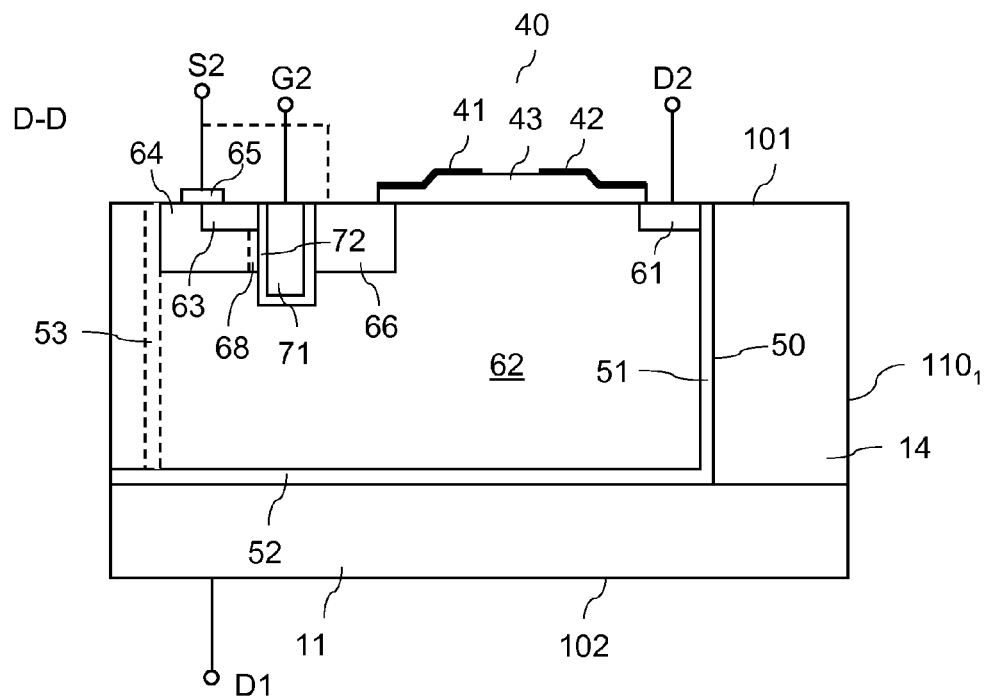
FIG. 6 illustrates a vertical cross sectional view of a high voltage device according to a first embodiment implemented in the semiconductor body.

FIG. 6 illustrates a vertical cross sectional view of the further dielectric well 50 in a longitudinal vertical section plane D-D illustrated in FIGS. 2 and 3. In this embodiment, a lateral power transistor, in particular a lateral power MOSFET, is implemented in the further dielectric well 50. The further dielectric well 50 includes a horizontal dielectric layer 52 that dielectrically insulates the semiconductor region within the dielectric well 50 from the drain region 11, and a vertical dielectric layer 51 that dielectrically insulates the semiconductor regions within the dielectric well 50 from semiconductor regions surrounding the further dielectric well 50 in lateral directions of the semiconductor body 100. The vertical dielectric layer 51 shown in FIG. 6, forms a longitudinal end of the further dielectric well 50. The further dielectric well 50 may correspond to the dielectric wells 20 including drift control regions concerning the size and the thickness of the dielectric layers. The further dielectric well 50 can be produced using the same process steps in which the dielectric wells 20 that include the drift control regions are formed.

Referring to FIG. 6, the lateral power transistor includes a drain region 61 and a source region 63 arranged distant to each other in a lateral direction of the semiconductor body 100. The lateral power transistor further includes a body region 64 and a drift region 62, where the body region 64 is arranged between the source region 63 and the drift region 62. The drift region 62 may adjoin the drain region 61. The lateral power transistor further includes a gate electrode 71 that is arranged adjacent to the body region 64 between the source region 63 and the drift region 62 and that is dielectrically insulated from these semiconductor regions by a gate dielectric 72. In the embodiment illustrated in FIG. 6, the gate electrode 71 is a trench electrode that is implemented in a trench extending from the first surface 101 into the semiconductor body 100. However, this is only an example. The gate electrode 71 could also be implemented as a planar gate electrode above the first surface 101. The main current flow direction of the lateral transistor according to FIG. 6 is the lateral direction of the semiconductor body 100, where only along the gate dielectric 72 the current flows in a vertical direction of the semiconductor body 100. Like in a conventional lateral power transistor, the source region 63 and the body region 64 are commonly connected to a source electrode 65, where this source electrode forms or is connected to a source terminal S2 of the lateral transistor. In FIG. 6, G2 denotes a gate terminal that is connected to the gate electrode 71, and D2 denotes a drain terminal that is connected to drain region 61 of the lateral transistor.

As illustrated in FIG. 6, the source and body regions 63, 64 may be arranged in the inner region of the semiconductor body 100 as defined by the edge termination structure 40, while the drain regions 61, may be arranged in the outer region of the semiconductor body 100 but within the further dielectric well 50. The distance between the source region 63 and the drain region 61 in the lateral direction of the semiconductor body 100 is selected dependent on a desired voltage blocking capability of the lateral transistor.

FIG. 6 illustrates one lateral transistor implemented in one further dielectric well 50. The lateral transistor is arranged in the region of one longitudinal end of the further dielectric well 50. In the region of the opposite longitudinal end of the further dielectric well 50 a further lateral transistor (not shown) can be implemented. A further, optional vertical dielectric layer 53 (illustrated in dashed lines in FIG. 6) can be arranged between these two lateral transistors. It is also possible to subdivide the further dielectric well 50 in the longitudinal direction into several dielectric sub-wells, wherein at least one of these sub-wells, namely the sub-well at one longitudinal end includes a power device, wherein in other sub-wells arranged in the inner region further devices, such as resistors or logic devices can be implemented.

The lateral transistor can be implemented as an enhancement transistor (enhancement MOSFET) or as a depletion transistor (depletion MOSFET) and can be implemented as an n-type or as a p-type transistor. In an enhancement transistor the body region 64 is doped complementarily to the source region 63, the drift region 62 and the drain region 61, where the doping concentration of the drift region 62 is lower than the doping concentrations of the source region 63 and the drain region 61. In a depletion transistor the body region 64 includes a channel region 68 (illustrated in dashed lines) of the same conductivity type as the source region 63 and the drift region 62 along the gate dielectric 72. In an n-type transistor the source region 63, the drift region 62 and the drain region 61 are n-doped, while in a p-type transistor the source region 63, the drift region 62 and the drain region 61 are p-doped.

In the lateral transistor illustrated in FIG. 6, the source region 63 is arranged on a side of the gate electrode 71 facing away from the drain region 61. Optionally, a semiconductor region 66 doped complementarily to the drift region 62 is arranged between that side of the gate electrode 71 facing the drain region 61 and the drift region 62. This semiconductor region 66 protects the gate dielectric 72 from high voltages and/or high electric fields when the lateral transistor is blocking (is in its off-state). According to one embodiment, the semiconductor region 66 is electrically connected to the source terminal S2 (as illustrated in dashed lines in FIG. 6). The operating principle of the lateral MOSFET according to FIG. 6 corresponds to the operating principle of a conventional MOSFET. Thus, the MOSFET is in an on-state when there is an electrically conducting channel along the gate dielectric 72 between the source region 63 and the drift region 62. The MOSFET is in the off-state, when there is no such conducting channel along the gate dielectric 72. In this case, a depletion region or space charge region expands in the drift region 62 starting from the pn-junction between the body region 64 and the drift region 62 and the pn-junction between the semiconductor region 66 and the drift region 62. The conducting channel along the gate dielectric 72 can be controlled through a drive potential applied to the gate terminal G2 and the gate electrode 71, respectively.

Figure 7:
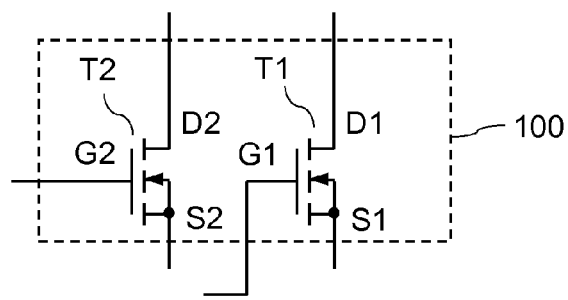
FIG. 7 illustrates an electrical circuit diagram of the power transistor and a high voltage device, implemented as a transistor, integrated in the semiconductor body.

FIG. 7 illustrates an electrical circuit diagram of the semiconductor arrangement with the vertical power MOSFET and the lateral power transistor explained before. The circuit diagram includes two transistors, namely a first transistor T1 formed by the vertical power transistor, a second transistor T2 formed by the lateral power transistor. As illustrated in dashed lines in FIG. 7, these two transistors T1, T2 are integrated in a common semiconductor body 100. There are six terminals available at the semiconductor body 100, namely the drain terminal D1, the source terminal S1 and the gate terminal G1 of the first transistor T1, and the drain terminal D2, the source terminal S2 and the gate terminal G2 of the lateral transistor T2. Just for illustration purposes it is assumed that the two transistors T1, T2 are n-type enhancement transistors.

Figure 8:
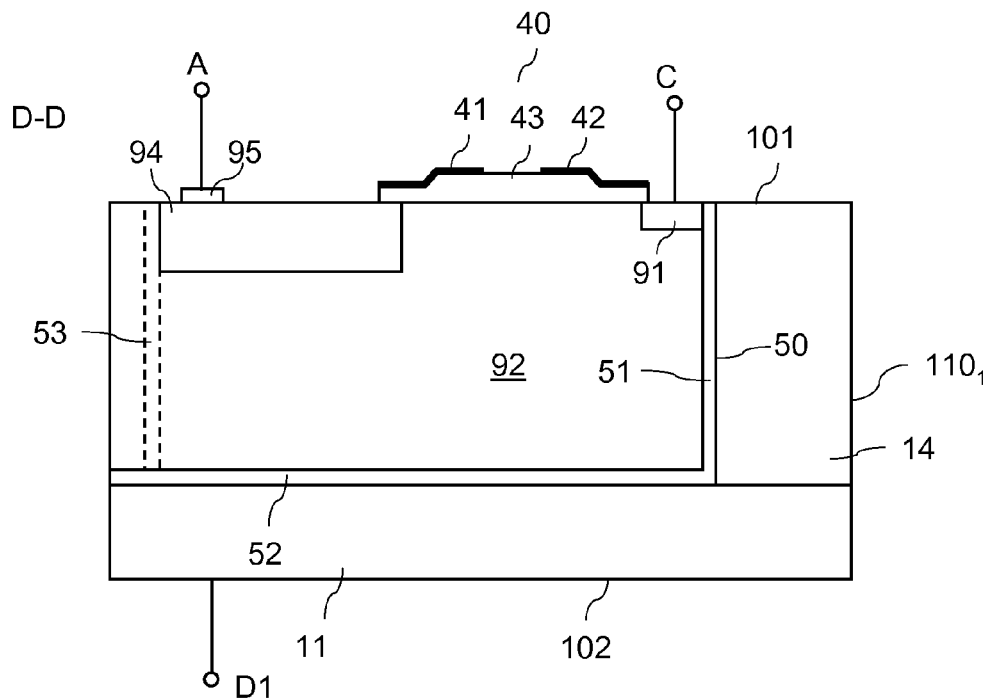
FIG. 8 illustrates a vertical cross sectional view of a high voltage device according to a second embodiment implemented in the semiconductor body.

FIG. 8 illustrates a vertical cross sectional view of the further dielectric well 50 in a longitudinal vertical section plane D-D illustrated in FIGS. 2 and 3. In this alternative embodiment, a lateral power diode is implemented in the further dielectric well 50.

Referring to FIG. 8, the lateral power diode includes a first emitter (cathode) region 91 and a second emitter (anode) region 94 that are distant in a lateral direction of the semiconductor body 100. The main current flow direction of the lateral diode according to FIG. 8 is the lateral direction of the semiconductor body 100. Like in a conventional lateral power diode, the anode region 94 is commonly connected to an anode electrode 95, where this anode electrode 95 forms or is connected to an anode terminal A of the lateral diode. In FIG. 8, C denotes a cathode terminal that is connected to cathode region 91 of the lateral diode.

As illustrated in FIG. 8, the anode regions 94 may be arranged in the inner region of the semiconductor body 100 as defined by the edge termination structure 40, while the cathode regions 91, may be arranged in the outer region of the semiconductor body 100 but within the further dielectric well 50. The distance between the anode region 94 and the cathode region 91 in the lateral direction of the semiconductor body 100 is selected dependent on a desired voltage blocking capability of the lateral diode.

In general, in the lateral MOSFET illustrated in FIG. 6 and in the lateral diode illustrated in FIG. 8, the drift region extends from inside the ring as defined by the edge termination to outside the ring as defined by the edge termination, or at least the dielectric well extends from inside the ring as defined by the edge termination to outside the ring as defined by the edge termination. This concept is, of course, not restricted to be applied in a MOSFET or a diode but may be applied to other types of power devices including a drift region as well.

FIG. 8 illustrates one lateral diode implemented in one further dielectric well 50. The lateral diode is arranged in the region of one longitudinal end of the further dielectric well. In the region of the opposite longitudinal end of the further dielectric well 50 a further lateral diode (not shown) or a lateral transistor can be implemented. A further, optional vertical dielectric layer 53 (illustrated in dashed lines in FIG. 8) can be arranged between these two lateral diodes or between the lateral diode and the lateral transistor.

Figure 9:
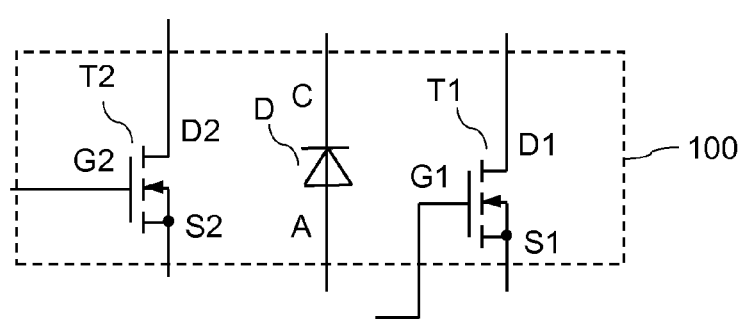
FIG. 9 illustrates an electrical circuit diagram of the power transistor and at least one high voltage device, implemented as a diode or a transistor, integrated in the semiconductor body.

FIG. 9 illustrates an electrical circuit diagram of the semiconductor arrangement with the vertical power MOSFET, and the lateral power diode D explained before. The circuit diagram includes a first transistor T1 formed by the vertical power transistor, and a diode formed by the lateral power diode. As illustrated in dashed lines in FIG. 9, the transistor T1 and the diode D are integrated in a common semiconductor body 100. There are five terminals available at the semiconductor body 100, namely the drain terminal D1, the source terminal S1 and the gate terminal G1 of the first transistor T1, and the anode terminal A, the cathode terminal C of the lateral Diode D. Just for illustration purposes it is assumed that the transistor T1 is an n-type enhancement transistor.

Optionally, not only the first transistor T1 and the diode D, but also the second transistor T2 is integrated in the semiconductor body 100. The circuit symbol of this second transistor T2 is also illustrated in FIG. 9. The second transistor T2 can be implemented as a lateral transistor as illustrated in FIG. 6. The second transistor T2 and the diode D can be arranged in one further dielectric wells on opposite longitudinal ends or can be arranged in two separate further dielectric wells 50. There are eight terminals at the semiconductor body 100 in this embodiment, namely the drain terminal D1, the source terminal S1 and the gate terminal G1 of the first transistor T1, the drain terminal D2, the source terminal S2 and the gate terminal G2 of the second transistor T2, and the anode terminal A and the cathode terminal C of the lateral Diode D.

Figure 10:
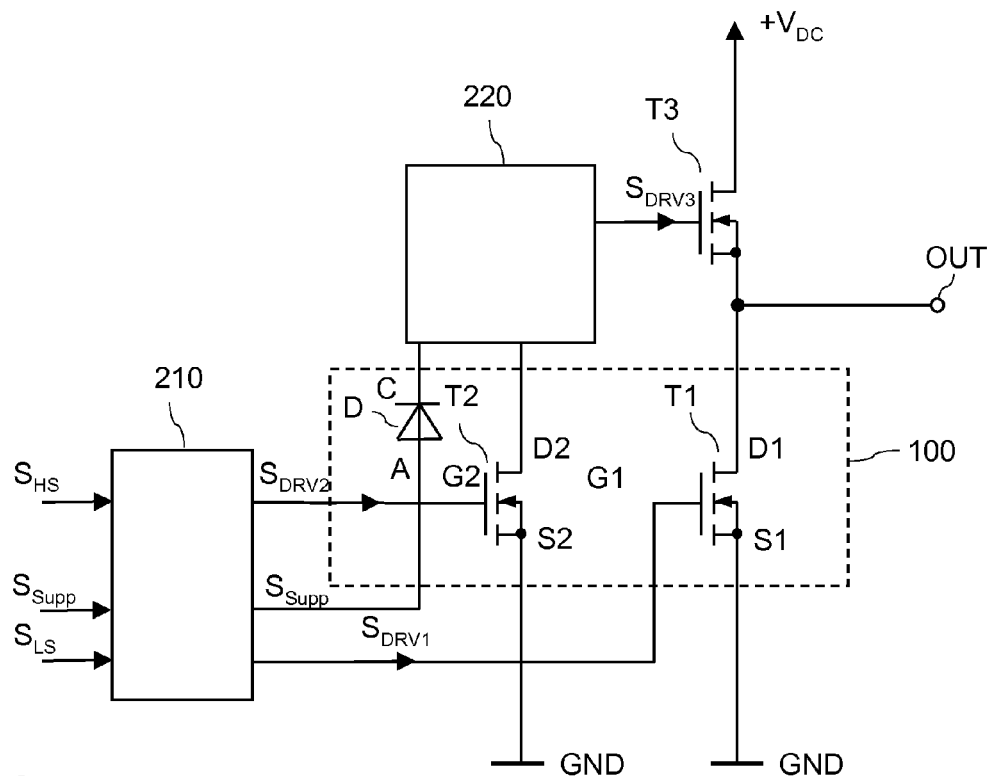
FIG. 10 illustrates an embodiment of a half-bridge circuit including a low-side transistor, a high-side transistor, a high-side drive circuit and a level-shifter transistor.

FIG. 10 illustrates a first embodiment of an application circuit in which the two transistors T1, T2 and the diode D integrated in the semiconductor body 100 are implemented. The circuit according to FIG. 10 is a half-bridge circuit with a low-side transistor which is formed by the first transistor T1, a high-side transistor T3, and a high-side drive circuit 220 including a level-shifter with a level-shifter transistor and including a bootstrap diode. The level-shifter transistor is formed by the second transistor T2. The bootstrap diode is formed by the lateral power diode D. In the embodiment illustrated in FIG. 10, the high-side transistor T3 and the low-side transistor T1 are both implemented as n-type enhancement MOSFETs. However, this is only an example. These two transistors could also be implemented as p-type MOSFETs or as complementary MOSFETs. The high-side transistor T3 and the low-side transistor T1 each have a load path that is formed by the drain-source paths of the MOSFETs and a control terminal that is formed by the gate terminal of the individual MOSFETs. In the embodiment illustrated in FIG. 10, the level-shifter transistor T2 is also implemented as an n-type enhancement MOSFET. However, this is only an example. The level-shifter transistor could be implemented as any type of transistor that can be integrated in the further dielectric well 50.

The load paths of the high-side transistor T3 and the low-side transistor T1 are connected in series between terminals for a positive supply potential $+V_{DC}$ and a negative supply potential or a reference potential GND, respectively. A circuit node that is common to load paths of the high-side transistor T3 and the low-side transistor T1 forms an output OUT of the half-bridge circuit.

The half-bridge circuit further includes a control circuit 210 that receives a first input signal $S_{LS}$ and a second input signal $S_{HS}$. The first input signal $S_{LS}$ defines a desired switching state of the low-side switch T1, and the second input signal $S_{HS}$ defines a desired switching state of the high-side transistor T3. The control circuit 210 is configured to generate a first drive signal $S_{DRV1}$ from the first input signal $S_{LS}$ and a second drive signal $S_{DRV2}$ from the second input signal $S_{HS}$. Alternatively and not shown in FIG. 11 the first drive signal $S_{DRV1}$ and the second drive signal $S_{DRV2}$ may be generated out of only one single input signal, for example by using the inverted input signal and adding certain delay times to prevent low-side switch T1 and high-side switch T3 to be in conduction mode at the same time. While the first drive signal $S_{DRV1}$ is directly received at the gate terminal of the low side transistor T1, a level-shifting of the signal level of the second drive signal $S_{DRV2}$ is required in order to drive the high-side transistor T3. The first and second drive signals $S_{DRV1}$, $S_{DRV2}$ may be signals that are referenced to the reference potential GND. While the low-side transistor T1 can be switched on an off using the first drive signal $S_{DRV1}$ referenced to the reference potential GND, a third drive signal $S_{DRV3}$ that is referenced to the electrical potential at the output terminal OUT of the half-bridge circuit is required for switching on and off the high-side transistor T3. This drive signal $S_{DRV3}$ is generated by the high-side drive circuit 220 using the level-shifter transistor T2 that is connected between the high-side drive circuit 220 and the reference potential GND. The level-shifter transistor T2 receives the second drive signal $S_{DRV2}$. The high-side drive circuit 220 is configured to evaluate a switching state of a level-shifter transistor T2 and to generate the third drive signal $S_{DRV3}$ dependent on the detected switching state of the level-shifter transistor T2. When, for example, the level-shifter transistor T2 is switched on through the second drive signal $S_{DRV2}$, the high-side drive circuit 220 generates the third drive signal $S_{DRV3}$ so as to switch on the high-side transistor T3. The voltage blocking capability of the level-shifter transistor T2 is about the voltage blocking capability of the low-side transistor T1, because dependent on the switching state of the half-bridge circuit, the voltage across the load path of the level-shifter transistor T2 is about the same as the voltage across the load path of the low-side transistor T1.

Diode D may, for example, be used as a bootstrap diode to generate a supply voltage of the high-side drive circuit 220 from the supply voltage $S_{Supp}$ of the low-side drive circuit 210. When transistor T1 is in the on-state, the reference potential of the high-side drive circuit 220 and of the high-side transistor T3 is close to the reference potential GND. Lateral power diode D therefore may be in forward operation and charging an energy storage (see, e.g., capacitive storage element 222 in FIG. 11) of high-side driving circuit 220. When transistor T1 is in off-state the reference potential of the high-side drive circuit 220 and of the high-side transistor T3 is close to the positive supply potential $+V_{DC}$, for example. In this operation state, the lateral diode D prevents the energy storage of the high-side circuit 220 from being discharged and thus ensures the operation of high-side circuit 220.

Figure 11:
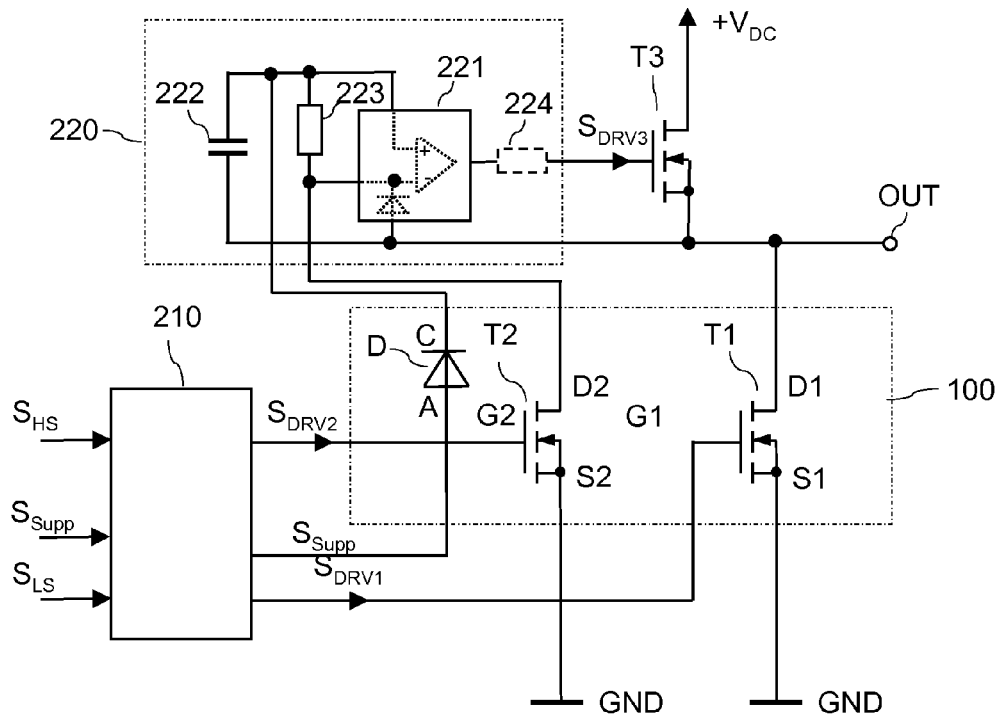
FIG. 11 illustrates the half-bridge circuit of FIG. 10 and one embodiment of the high-side drive circuit in detail.

FIG. 11 illustrates the half-bridge circuit according to FIG. 10, wherein an embodiment of the high-side drive circuit 220 is illustrated in greater detail. In this embodiment, the high-side drive circuit 220 includes a drive unit 221 with supply terminals connected to an energy storage element 222 which is shown here as a capacitor, an output terminal coupled to the gate terminal of the high-side transistor T3, and an input terminal. Optionally, a gate resistor 224 is connected between the output of the drive unit 221 and the gate terminal of the high-side transistor T3. A first one of the supply terminals of the drive unit 221 is connected to a positive supply terminal of the energy storage element 222, while a second supply terminal is connected to a negative supply terminal of the energy storage element 222 and to the output OUT of the half-bridge circuit. Thus, the electrical potential at the first supply terminal of the drive unit 221 corresponds to the electrical potential of the output terminal OUT plus the supply voltage provided by the energy storage element 222. The energy storage element 222 may be charged by the bootstrap diode D as explained before.

However, the energy storage element 222 may also be another voltage source that can be employed in a high-side drive circuit. In this case, the bootstrap diode D can be omitted or can be used for other purposes in the circuit.

An impedance 223, such as a resistor, is connected between the first supply terminal and the input terminal of the drive unit 221 and is connected in series with the load path of the level-shifter transistor T2, where the series circuit with the impedance 223 and the level-shifter transistor T2 is connected between the positive supply terminal of the energy storage element 222 and reference potential GND. The drive unit 221 is configured to evaluate a voltage across the impedance 223 and to generate the third drive signal $S_{DRV3}$ dependent on the detected voltage across the impedance 223, where this voltage is dependent on the switching state of the level-shifter transistor T2. Alternatively and not shown in FIG. 11, an additional impedance may be placed between impedance 223 and terminal D2 of the level-shifter transistor T2 to reduce e.g. current values and power losses.

The operating principle of the half-bridge circuit according to FIG. 11 is now explained. For explanation purposes it is assumed that both, the low-side transistor T1 and the high-side transistor T3 are switched off and that in a next step switching on of the high-side transistor T3 is desired. It is further assumed, that the electrical potential at the output OUT is somewhere between the reference potential GND and the positive supply potential $+V_{DC}$. This potential at the output OUT is dependent on the characteristic of a load (not illustrated) connected to the output OUT and may, e.g. during turn-off of transistor T1 even exceed the positive supply potential $+V_{DC}$. Just for explanation purposes it is assumed that the electrical potential at the output OUT is about 50% of the positive supply potential $+V_{DC}$. The supply potential $+V_{DC}$ is, for example, in the range of between 300V and 600V.

When the level-shifter transistor T2 is switched off, the voltage across the impedance 223 is zero, and the voltage across the level-shifter transistor T2 corresponds to the electrical potential at the output OUT plus the supply voltage of the energy storage element 222. Thus, a voltage blocking capability of the level-shifter transistor T2 is required that is at least the voltage blocking capability of the low-side transistor T1.

When the second drive signal $S_{DRV2}$ switches the level-shifter transistor T2 on, a current flows through the impedance 223, so that the voltage across the impedance 223 increases, where the electrical potential and the input of the drive unit 221 may even fall below the electrical potential at the output terminal OUT. According to one embodiment, the drive unit 221 includes a protection circuit that prevents the electrical potential at the input of the drive unit 221 to significantly drop below the electrical potential at the output OUT. According to one embodiment, a diode or an Avalanche or Zener diode (illustrated in dotted lines) or an arrangement with a plurality of diodes and/or Avalanche or Zener diodes connected in series can be connected between the second supply terminal and the input terminal. The drive unit 221 may either evaluate the voltage across the impendence 223 or may detect a decrease of the electrical potential at the input terminal to below the electrical potential at the output OUT (not shown in FIG. 11), which is the electrical potential at the second supply terminal of the drive unit 221. According to one embodiment, the drive unit 221 generates a signal level of the drive signal $S_{DRV3}$ that switches the high-side transistor T3 on when the electrical potential at the input terminal of the drive unit 221 falls below the electrical potential at the second supply terminal of the drive unit 221.

Besides a high voltage blocking capability, the level-shifter transistor T2 may also have a high on-resistance, so as to prevent the level-shifter transistor T2 from discharging the energy storage element 222 and from changing the electrical potential at the output terminal OUT.

Figure 12:
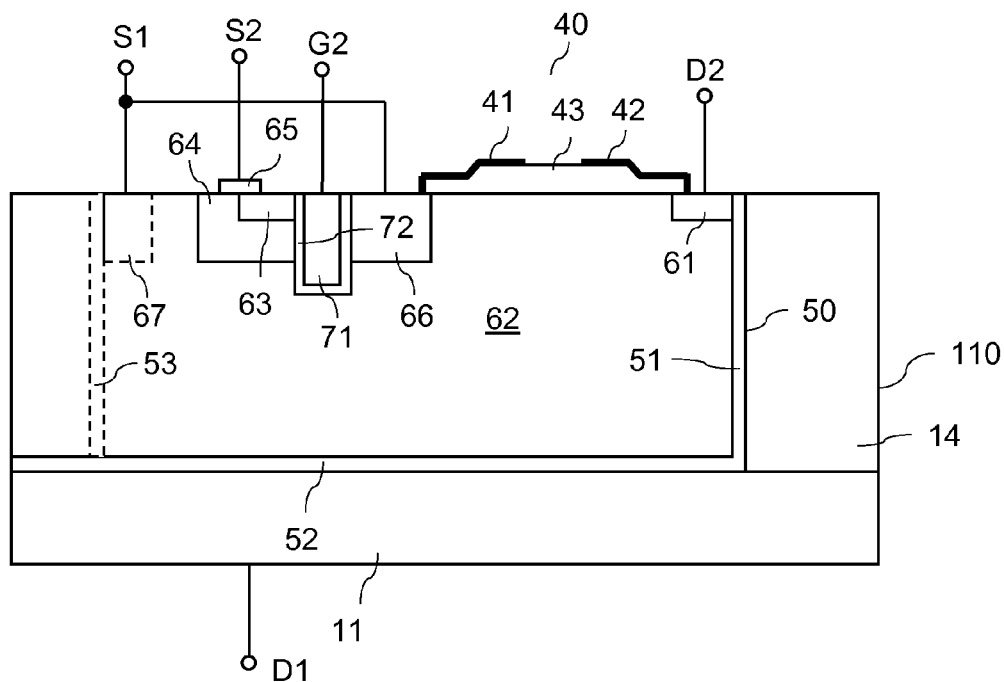
FIG. 12 illustrates a vertical cross sectional view of a high voltage device according to a third embodiment.

FIG. 12 illustrates a further embodiment of a lateral power transistor implemented in the further dielectric well 50. The power transistor according to FIG. 12 is based on the power transistor illustrated in FIG. 6. In the power transistor according to FIG. 12, the semiconductor region 66 that protects the gate electrode 71 from high voltages and which can drain leakage currents is electrically connected to the source terminal S1 of the vertical power transistor. Optionally, the transistor includes a further semiconductor region 67 doped equal to the semiconductor region 66, arranged in the drift region 62 in the region of the body region 64 and also connected to the source terminal S1 of the vertical power transistor. The semiconductor region 67 can also serve to drain a leakage current to a power terminal (in this case the source terminal S1). A leakage current may be thermally generated in the drift region 62 during blocking operation of the lateral power transistor and to prevent this leakage current to reach a driver circuit.

Figure 13:
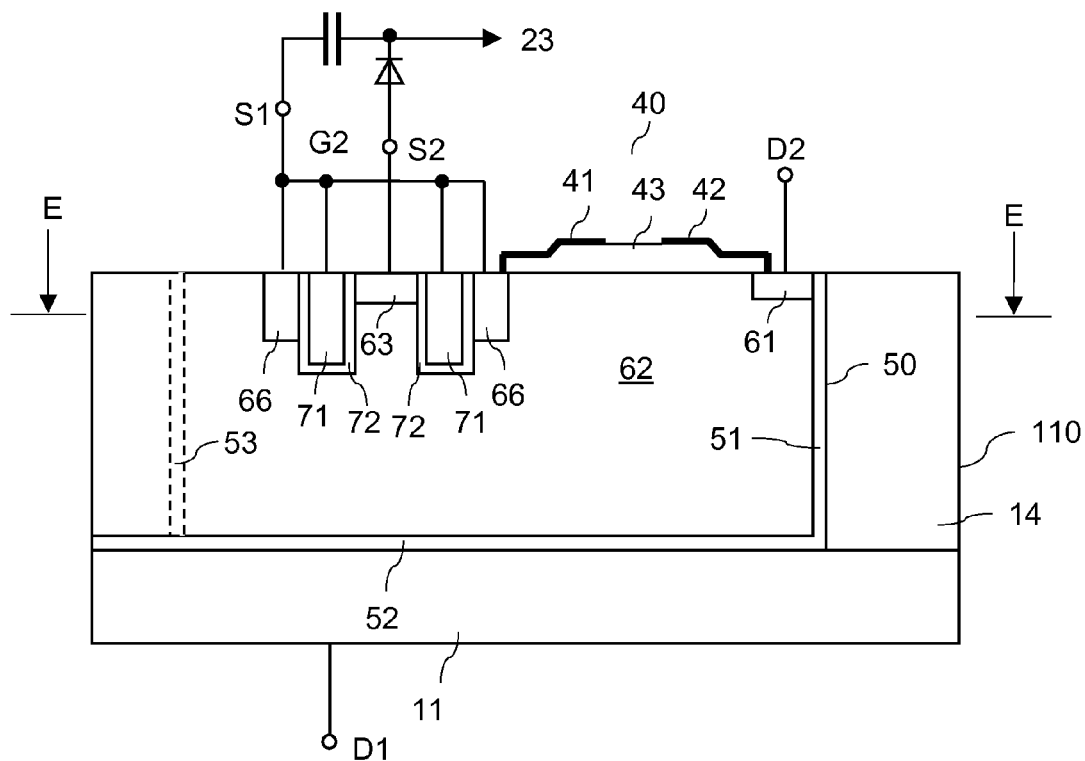
FIG. 13 illustrates a vertical cross sectional view of a high voltage device implemented as a depletion transistor.

FIG. 13 illustrates a further embodiment of a lateral power transistor implemented in the dielectric well 50. This power transistor is implemented as a depletion transistor and has a source region 63 arranged between two gate electrodes 71 or between two sections of one gate electrode 71. The at least one gate electrode 71 is arranged in a trench extending into the semiconductor body 100 from the first surface 101. A section of the drift region 62 extends to the source region 63 between these two gate electrodes 71 or gate electrode sections, respectively. The gate electrode 71 or gate electrode sections are dielectrically insulated from the semiconductor body 100 by gate dielectrics 72.

Figure 14:
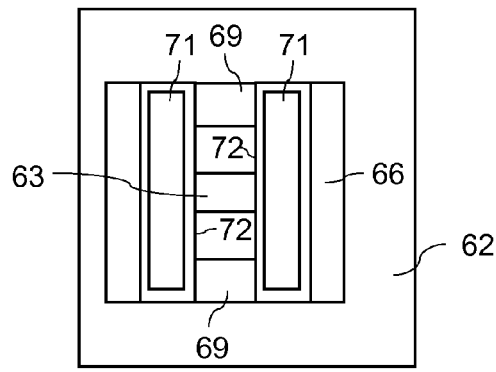
FIG. 14 illustrates a horizontal cross sectional view of a gate structure of the depletion transistor according to FIG. 13.

FIG. 14 illustrates a horizontal cross sectional view of the power transistor of FIG. 13 in the region of the at least one gate electrode 71 and the source region 63. In the embodiment illustrated in FIG. 14, the source region 63 is arranged between two gate electrodes 71 each dielectrically insulated from the semiconductor body 100 by a gate dielectric 72. According to a further embodiment (not shown) there is a ring-shaped gate electrode 71, wherein the source region 63 is arranged within this ring. Between the two gate electrodes 71 or the two gate electrode sections, respectively, at least one semiconductor region 69 of a doping type complementary to the doping type of the source region 63 is arranged. This at least one region 69 is arranged distant to the source region 63, so that a section of the drift region 62 is arranged between the source region 63 and the semiconductor region 69.

The operating principle of the lateral depletion transistor illustrated in FIG. 13 is as follows: for explanation purposes it is assumed that a depletion transistor is an n-type transistor in which the source region 63, the drain region 61 and drift region 62 are n-doped, while the at least one semiconductor region 69 is p-doped. The at least one gate electrode 71 is electrically connected to a terminal for a reference potential, such as the source terminal S1 of the vertical power transistor. The MOSFET switches off, when the electrical potential at the source terminal S2 of the lateral transistor increases above the electrical potential of the gate electrode 71 so that the section of the drift region 62 arranged between the gate electrodes 71 is depleted from charge carriers. An increase of the electrical potential at the source terminal S2 of the lateral power transistor may, for example, occur when the lateral transistor is used to charge a capacitor connected between the source terminal S2 of the lateral transistor and the terminal for the reference potential, such as the source terminal S1 of the vertical power transistor. Such a capacitor is illustrated in dashed lines in FIG. 13. According to one embodiment, the capacitor is the capacitor 32 as illustrated in FIG. 1.

According to another embodiment, the capacitor is the energy storage element 222 of FIG. 11. According to another embodiment the capacitor 32 as illustrated in FIG. 1 and the energy storage element 222 as illustrated in FIG. 11 are implemented by one and the same capacitive storage element or are implemented by two capacitive storage elements connected in parallel. In order to prevent this capacitor from being discharged through the lateral transistor, a rectifier element, such as a diode, which is also illustrated in FIG. 13, is connected between the source terminal S2 of the lateral power transistor and the capacitor. The lateral depletion transistor of FIG. 13 hence forms an alternative to a bootstrap diode or to another voltage source to deliver a supply power to the high-side driver of a half bridge arrangement of power transistors.

The lateral transistor illustrated in FIG. 14, further includes two semiconductor regions 69 doped complementarily to the drain region 11 and adjoining the gate dielectrics 72 on sides facing away from the channel region. These semiconductor regions may also be connected to the source terminal S1 of the vertical power transistor.

The at least one semiconductor region 69 illustrated in FIG. 14 serves to prevent the accumulation of minority charge carriers along the gate dielectric 72. This semiconductor region 69 is, for example, also connected to the source terminal S1 of the vertical power transistor.

The channel region may have the same doping concentration as the drift region 62, but may also have a doping concentration different from the doping concentration of the drift region 62. The doping concentration of the channel region is one of the parameters influencing the pinch-off voltage of the depletion transistor.

Figure 15:
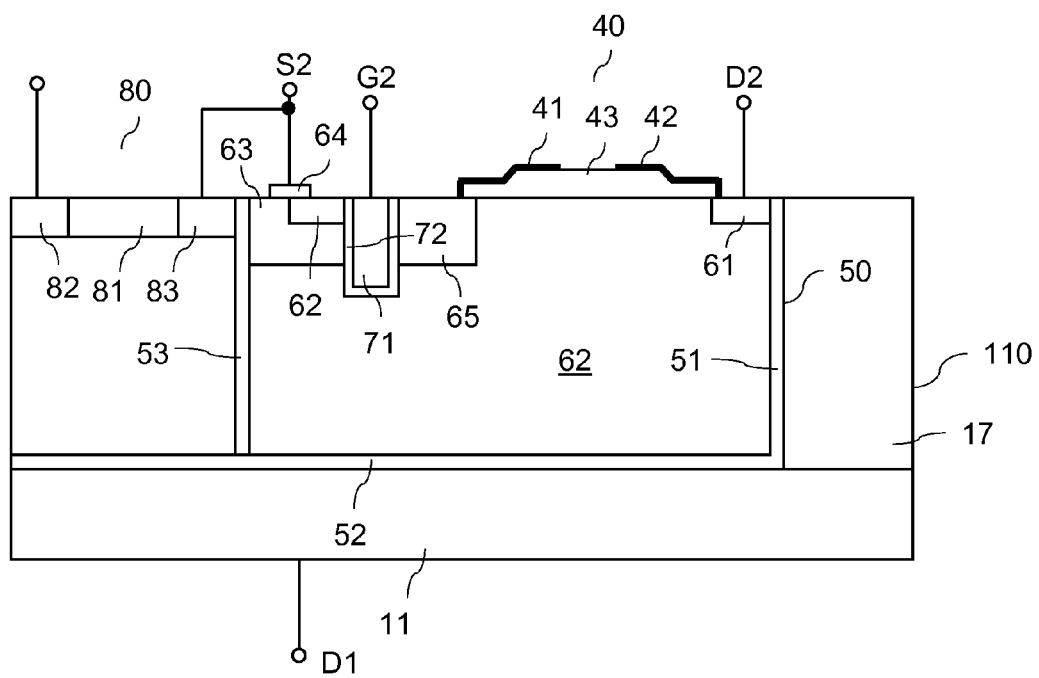
FIG. 15 illustrates a vertical cross sectional view of a high voltage device implemented as a MOSFET and of a resistor connected in series with the MOSFET.

FIG. 15 illustrates a further embodiment of implementing a power semiconductor device in the further dielectric well 50. In this embodiment, besides a lateral power transistor a resistor 80 is integrated in the further dielectric well 50. Alternatively, the lateral power transistor and the resistor 80 are integrated in two different further dielectric wells 50. The lateral power transistor according to FIG. 15 corresponds to the power transistor according to FIG. 6. However, this is only an example. Any other type of lateral power transistor may be implemented as well. The region of the dielectric well 50 in which the resistor 80 is implemented is dielectrically insulated from the lateral power transistor by a further vertical dielectric layer 53. The resistor 80 includes first doped semiconductor region 81 having a doping concentration of, for example, between $10^{11}$ and $10^{16}$ cm$^{-3}$ and two higher doped contact regions 82, 83 arranged distant to other in a lateral direction. The doping types of the individual semiconductor regions 81, 82, 83 are identical. One of the contact regions, namely the second contact region 83 in the embodiment as illustrated, is connected to the source terminal S2 of the lateral power transistor, so that the resistor 80 is connected in series with load path of the lateral power transistor.

Figure 16:
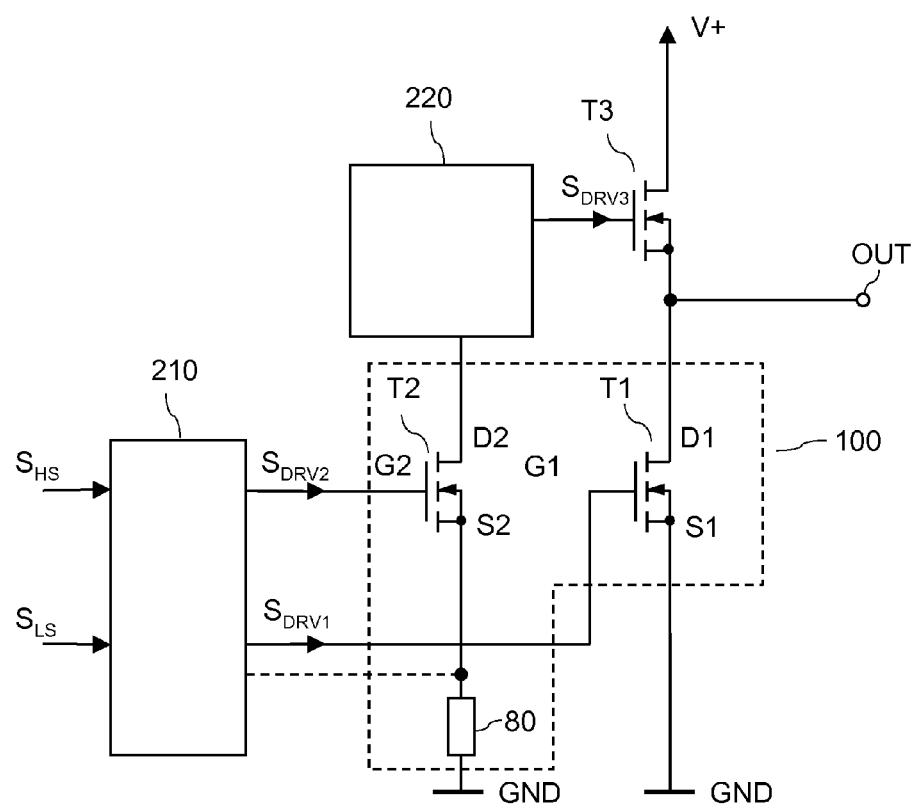
FIG. 16 illustrates a circuit diagram of half-bridge circuit including a low-side transistor, a high-side-transistor, a level-shifter transistor and a current sense resistor implemented in a common semiconductor body.

The application of the electronic circuit with the vertical power transistor T1, the lateral power transistor T2 and the resistor 80 connected in series with the load path of the lateral power transistor T2 is illustrated in FIG. 16. The electronic circuit illustrated in FIG. 13 is based on the half-bridge circuit illustrated in FIG. 7 with the difference that the resistor 80 is connected in series with the load path of the level-shifter transistor T2. The resistor 80 is connected to the control circuit 210. In this embodiment, the control circuit 210 is configured to evaluate a voltage drop V80 across the resistor 80. This voltage drop V80 is dependent on a temperature of the resistor 80. Since the resistor 80 is integrated in same semiconductor body 100 as the low-side transistor T1, the temperature of the resistor 80 corresponds to the temperature of the low-side transistor T1.

In an alternative embodiment (not shown in FIG. 16) one or both terminals of the resistor 80 may be directly connected to the control circuit 210 without a connection to the lateral power transistor T2 or having e.g. a common ground potential with the lateral power transistor T2. In this case the current flowing through the resistor 80 must be generated by the control circuit 210 to get the temperature dependent voltage drop V80.

Figure 17:
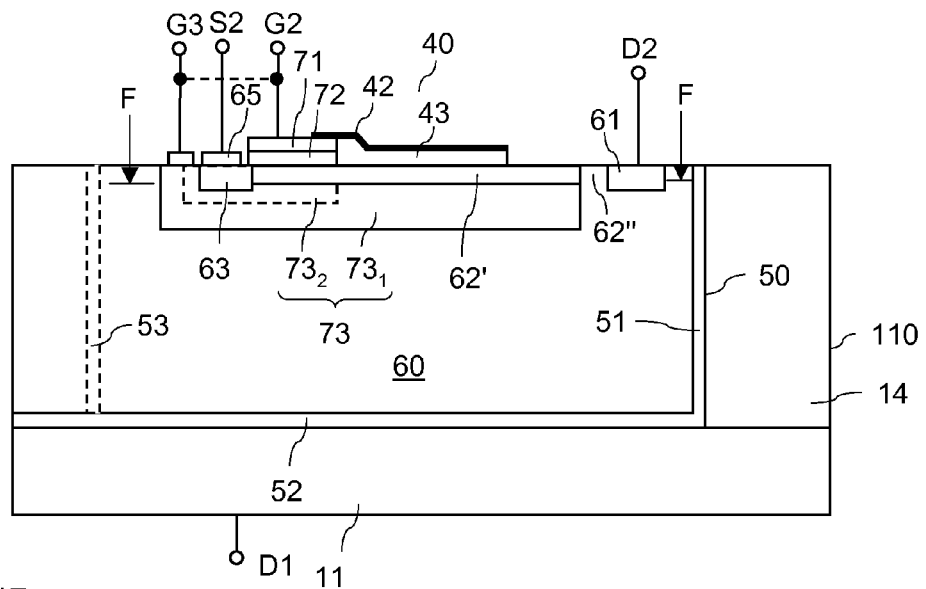
FIG. 17 illustrates a vertical cross sectional view of a lateral depletion transistor according to a further embodiment.

FIG. 17 illustrates a vertical cross sectional view of a lateral power transistor according to a further embodiment implemented in the further dielectric well 50. Like the lateral power transistors illustrated in FIGS. 13 to 14, the lateral power transistor according to FIG. 17 is implemented as a depletion transistor. In the depletion transistor of FIG. 17 like features as in the transistors according to FIGS. 13 to 14 have the same reference characters.

Referring to FIG. 17, the lateral transistor includes a drain region 61 and a source region 63 that are distant in the lateral direction of the semiconductor body 100 and within the dielectric well 50. A drift region extends between the drain region 61 and the source region 63. The drift region has the same conductivity type as the drain region 61 and the source region 63, has a lower doping concentration than the source and drain regions 63, 61 and may have two drift region sections, namely a first drift region section 62' adjoining the source region 63, and an optional second drift region section 62" adjoining the first drift region section 62' and the drain region 61. The doping concentration of the first drift region section 62' is, for example, between $10^{13}$ cm$^{-3}$ and $10^{17}$ cm$^{-3}$.

The source and drain regions 63, 61, the drift region 62', 62" and the semiconductor region 73 explained below are embedded in a semiconductor region 60 having a basic doping of the same doping type as the source and drain regions 63, 61 but with a lower doping concentration. This semiconductor region 60 corresponds to the drift region 62 in the embodiments explained before. The doping concentration of the second drift region section 62" may correspond to the doping concentration of the region 60 with the basic doping, while the doping concentration of the first drift region section 62' is higher than the doping concentration of the region 60 with the basic doping.

The doping concentration of the drain and source regions 61, 63 is, for example, between 1E19 cm$^{-3}$ and 1E21 cm$^{-3}$. The first drift region section 62' is, e.g., an implantation region having a doping dose of about 1E12 cm$^{-2}$.

The drain region 61, the source region 63 and the drift region 62', 62" are n-doped in an n-type depletion transistor and are p-doped in a p-type depletion transistor.

The depletion transistor of FIG. 17 includes two control structures for controlling a conducting channel in the drift region 62', 62", specifically in the first drift region section 62', between the source region 63 and the drain region 61. A first control structure includes a gate electrode 71 above the first drift region section 62' and dielectrically insulated from the first drift region section 62' by a gate dielectric 72. The second control structure includes a doped semiconductor region 73 of a conductivity type complementary to the conductivity type of the drift region 62', 62". The semiconductor region 73 will be referred to as base region in the following. The base region 73 is located below the first drift region 62' and opposite the gate electrode 71, so that there is a section of the first drift region section 62' that is between the gate electrode 71 and the base region 73. The base region 73 is connected to a first gate terminal G2 to which the gate electrode 71 is connected to, or can be connected to a separate gate terminal G3. In the embodiment illustrated in FIG. 17, in the lateral direction of the semiconductor body 100 the base region 73 extends as far in the direction of the drain region 61 as the first drift region section 62'. A distance between the first drift region section 62' and the drain region 61 in the lateral direction is defined by the second drift region section 62". This distance may be between 0, when the second drift region section 62" is omitted, and several 10 µm. The length of the first drift region section 62' is the dimension of the drift region 62' in the lateral direction between the source region 63 and the drain region 61.

As illustrated in FIG. 17, the drift region 62' is located below an edge termination structure 40 with at least one field electrode 42. Referring to FIG. 17, the at least one field electrode 42 can be connected to the gate electrode 71.

Optionally, the base region 73 has a higher doped region $73_2$ adjoining the drift region 62' below the gate electrode 71 and a lower doped region $73_1$ adjoining the higher doped region $73_2$. The higher doped region $73_2$ may extend as far in the direction of the drain region 61, or may be shorter. According to one embodiment, the higher doped region $73_2$ extends as far in the direction of the drain region 61 as the gate dielectric 72, and extending farther in the direction of the drain region 61 than the higher doped region $73_2$. A dopant dose of the lower doped region $73_1$ is, e.g., about 1.0E12 cm$^{-2}$ while the dopant dose of the higher doped region $73_2$ is, e.g., about 5E12 cm$^{-2}$. The lower doped region $73_1$ extends deeper into the semiconductor body 100 than the higher doped region $73_2$. For example, the lower doped region $73_1$ and the higher doped region $73_2$ are regions that have been formed by ion implantation, where an implantation energy of the (deeper) lower doped region $73_1$ is higher, e.g., 3 MeV, than an implantation energy of the higher doped region $73_2$. The implantation energy of the higher doped region $73_2$ is, e.g., between 1 MeV and 2 MeV.

In the transistor of FIG. 17, there is a conducting channel in the drift region between the source region 63 and the drain region 61 when the voltages between gate terminals G2, G3 and the source terminal S2 is zero. When the absolute values of these voltages increase, so that the voltages become negative in an n-type transistor or become positive in a p-type transistor, the conducting channel is pinched by two effects: a depletion region expanding from the pn-junction between the base region 73 and the drift region 62'; and a depletion region generated below the gate electrode 71. The transistor of FIG. 17 can be used and can be interconnected in the same way as the transistors of FIGS. 13 to 14, e.g., for charging a capacitive storage element.

Figure 18:
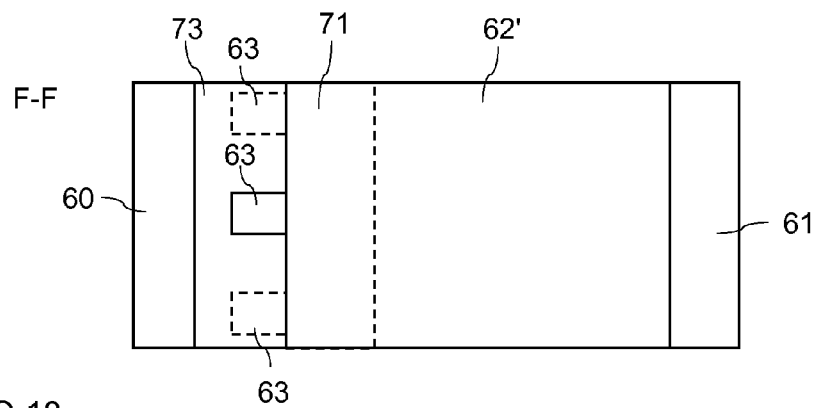
FIG. 18 illustrates a horizontal cross sectional view of the transistor of FIG. 17.

FIG. 18 illustrates a horizontal cross sectional view of the depletion transistor of FIG. 17. Referring to FIG. 18, there could be one source region 63, or there could be several source regions 63 (illustrated in dashed lines), where the several source regions are distant in a direction perpendicular to the current flow direction. The "current flow direction" is the direction in which the source and drain regions 63, 61 are distant.

Figure 19:
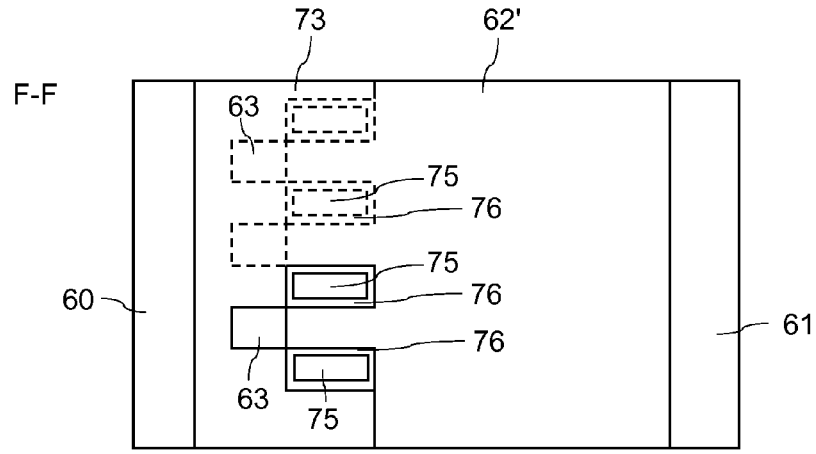
FIG. 19 illustrates a horizontal cross sectional view of the transistor of FIG. 17 according to a further embodiment.

FIG. 19 illustrates a horizontal cross sectional view of the depletion transistor of FIG. 17 according to a further embodiment. In the transistor of FIG. 19, the drift region 62' includes a fin-like semiconductor region adjacent the source region 63 and between two distant trenches, where in each of these trenches an additional gate electrode 75 is integrated that is dielectrically insulated from the drift region by a further gate dielectric 76. The additional gate electrodes 75 are connected to the first or second gate terminals G2, G3. In the transistor of FIG. 19, the additional gate electrodes 75 additionally to the gate electrode 71 (see FIG. 17) and additionally to the base region 73 serves to control a conducting channel in the fin-like region and, therefore serve to switch the depletion transistor on and off. According to one embodiment, the transistor only includes the gate electrodes 75 in the trenches, so that the gate electrode 71 above the drift region is omitted. In a semiconductor device with several source regions 63, two gate electrodes 75 are adjacent each section of the drift region 62' adjoining one source region 63.

Figure 20:
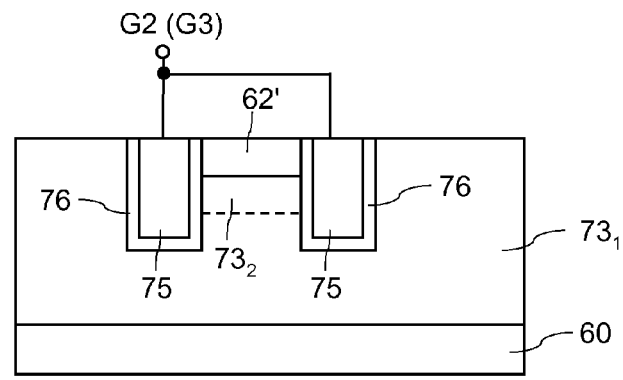
FIG. 20 illustrates a vertical cross sectional view of the transistor of FIG. 19.

FIG. 20 illustrates a vertical cross sectional view of the transistor of FIG. 19 in the region of the semiconductor fin. Referring to FIG. 20, the semiconductor fin between the gate electrodes 75 includes a section of the drift region 62' and a section of the base region 73, where according to one embodiment, the higher doped region $73_2$ does not extend to below the trenches with gate electrodes 75, while the lower doped region 73₁ surrounds the gate electrodes 75 and the gate dielectrics outside the semiconductor fin.

Figure 21:
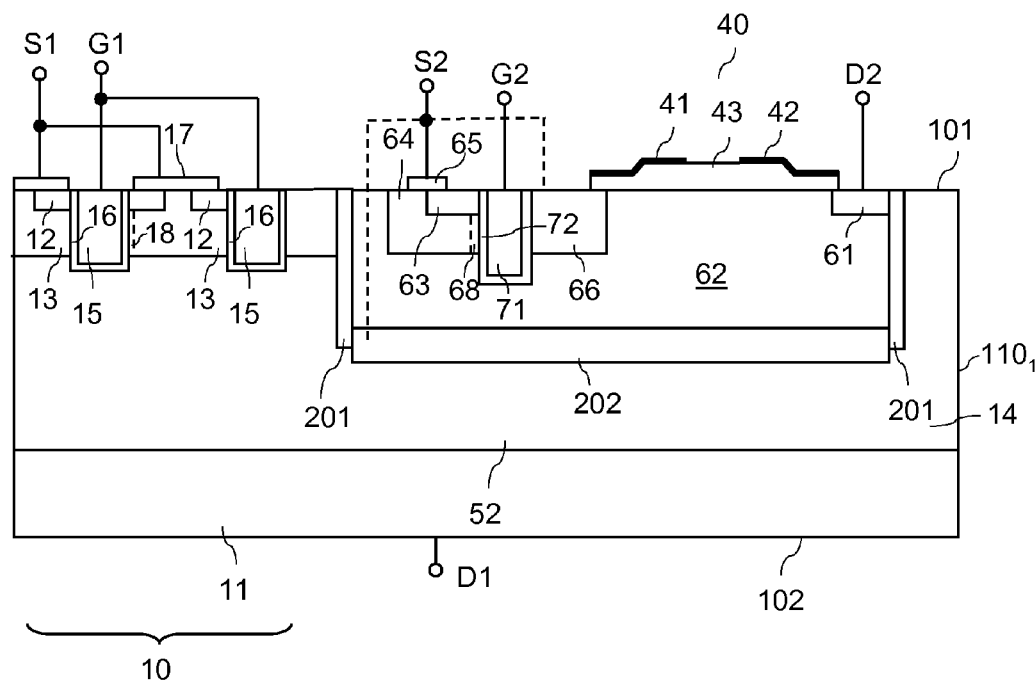
FIG. 21 illustrates a vertical cross sectional view of a semiconductor arrangement including a vertical power transistor and a high voltage device according to a further embodiment.

FIG. 21 illustrates a vertical cross sectional view of a semiconductor arrangement with a vertical power transistor and a high voltage device according to a further embodiment. In this embodiment, the vertical power transistor 10 is implemented as a vertical power MOSFET and includes a plurality of transistor cells connected in parallel. Each transistor cell includes a source region 12, a body region 13 a drift region 14 and a drain region 11, wherein the drift region 14 and the drain region 11 are common to the individual transistor cells (are shared by the individual transistor cells). Each transistor cell further includes a gate electrode 15 arranged adjacent the body region 13 and dielectrically insulated from the body region 13 by a gate dielectric 16. The gate electrodes 15 are arranged in trenches in the embodiment illustrated in FIG. 21. However, this is only an example. Other gate topologies, such as planar gates could be implemented as well. In the vertical power transistor of FIG. 21 the same device regions as in the vertical power transistor of FIG. 1 have the same reference numerals.

Referring to FIG. 21, a high voltage device is integrated in the semiconductor body 100. In this embodiment, the high voltage device is implemented as a lateral MOSFET corresponding to the lateral MOSFET illustrated in FIG. 6. However, this is only an example. Instead of a MOSFET another type of lateral power device, such as a lateral power diode illustrated in FIG. 8 could be implemented as well. Unlike the lateral MOSFET of FIG. 6 or the lateral diode of FIG. 8, the lateral power device of FIG. 21 is arranged within a well-like structure including dielectric sidewalls 201 and a semiconductor bottom region 202 (buried region) adjoining the sidewalls 201. The bottom region 202 has a conductivity type complementary to the conductivity type of the drift region 62 of the lateral power device. The dielectric sidewalls 201 encircle the drift region 62 and may include a conventional dielectric material such as, e.g. an oxide, a nitride, or the like. The buried bottom region 202 may be electrically connected to the source terminal S2, which is illustrated in dashed lines in FIG. 21.

The vertical power transistor includes an edge termination 40 that corresponds to the edge termination 40 explained herein before. The drift region 62 of the lateral power device is located below the edge termination 40 and extends from inside a ring as defined by the edge termination 40 to outside the ring as defined by the edge termination 40, so that in the embodiment of FIG. 21 the source region 63 of the lateral MOSFET is inside the ring, while the drain region 61 is outside the ring. This corresponds to the relationship between the drift region 62 of the lateral MOSFET of FIG. 6 and the edge termination 40 of FIG. 6. In an embodiment in which the high voltage device is implemented as a lateral diode, one of the anode regions and the cathode regions is located inside the ring, while the other one of the anode region and the cathode region is located outside the ring.

Figure 22:
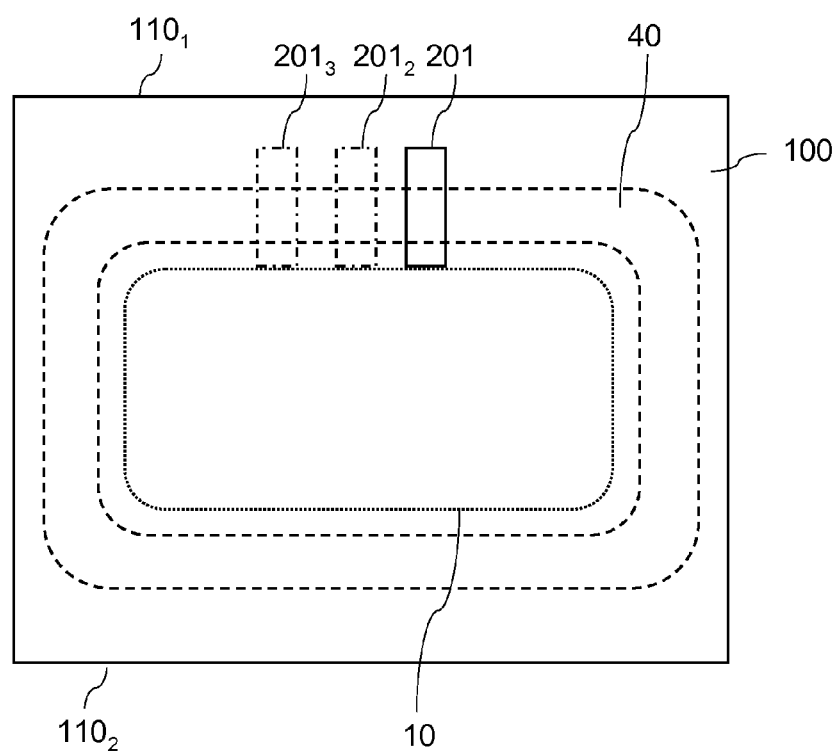
FIG. 22 illustrates a horizontal cross sectional view of the semiconductor arrangement of FIG. 21.

FIG. 22 illustrates a horizontal cross sectional view of the semiconductor arrangement of FIG. 21. FIG. 22 schematically illustrates the semiconductor body 100 with the edge termination 40 and the dielectric sidewalls 201 of the well-like structure. Reference numeral 10 denotes a region in which the transistor cells of the vertical power transistor are integrated. As can be seen from FIG. 22, the well-like structure extends from inside the ring as defined by the edge termination 40 to outside the ring as defined by the edge termination 40.

Referring to what is illustrated in dashed and dotted lines in FIG. 22, several well-like structures can be provided in the semiconductor body 100, where different lateral power devices can be integrated in these well-like structures.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A half-bridge circuit, comprising:
    a low-side transistor and a high-side transistor each comprising a load path and a control terminal,
    a high-side drive circuit comprising a level shifter with a level shifter transistor,
    wherein the low-side transistor and the level shifter transistor are integrated in a common semiconductor body; and
    an edge termination comprising a field electrode arranged above the first surface of the semiconductor body, the edge termination defining a ring;
    wherein the level-shifter transistor is implemented as a MOSFET, comprising:
        a further source region, a further drift region and a further channel region arranged between the further source region and the further drift region; and
        a further gate electrode arranged adjacent to the further channel region and dielectrically insulated from the further channel region by a further gate dielectric
    wherein the MOSFET is a lateral MOSFET in which the source region and the drain region are distant in a lateral direction of the semiconductor body;
    wherein one of the source and drain regions of the lateral MOSFET is arranged inside the ring as defined by the edge termination, and wherein the other one of the source region and the drain region is arranged outside the ring as defined by the edge termination.

2. The half-bridge circuit of claim 1, further comprising a diode integrated in the common semiconductor body.

3. The half-bridge circuit of claim 1, wherein the low-side transistor comprises a source region, a drain region, a body region and a drift region arranged in the semiconductor body, a gate electrode arranged adjacent to the body region and dielectrically insulated from the body region by a gate dielectric, and wherein the level-shifter transistor is arranged within a well-like dielectric structure in the semiconductor body and comprising a further drift region.

4. The half-bridge circuit of claim 2, wherein the diode is arranged within a well-like dielectric structure in the common semiconductor body.

5. The half-bridge circuit of claim 3, further comprising a drift control region having a drain-sided end, and wherein a rectifier element is connected between the drain region and the drain-sided end of the drift control region.

6. The half-bridge circuit of claim 1, wherein the low-side transistor is implemented as a vertical power transistor, wherein at least the source region of the power transistor is arranged inside the ring.

7. The half-bridge circuit of claim 3, wherein the low-side transistor further comprises a drift control region arranged adjacent to the drift region and dielectrically insulated from the drift region by a drift control region dielectric.

8. The half-bridge circuit of claim 6, wherein the further drift region vertically extends to the first surface adjacent the edge termination, and wherein the further drift region laterally extends from inside the ring to outside the ring.

* * * * *